(12) United States Patent
Glukhoy

(10) Patent No.: US 9,484,190 B2
(45) Date of Patent: Nov. 1, 2016

(54) SHOWERHEAD-COOLER SYSTEM OF A SEMICONDUCTOR-PROCESSING CHAMBER FOR SEMICONDUCTOR WAFERS OF LARGE AREA

(71) Applicant: Yuri Glukhoy, San Francisco, CA (US)

(72) Inventor: Yuri Glukhoy, San Francisco, CA (US)

(73) Assignees: Yuri Glukhoy, San Francisco, CA (US); Anna Ryaboy, San Francisco, CA (US); Tatiana Kerzhner, San Francisco, CA (US)

( * ) Notice: Subject to any disclaimer, the term of this patent is extended or adjusted under 35 U.S.C. 154(b) by 378 days.

(21) Appl. No.: 14/164,182

(22) Filed: Jan. 25, 2014

(65) Prior Publication Data

US 2015/0214009 A1   Jul. 30, 2015

(51) Int. Cl.

| | |
|---|---|
| *C23C 16/50* | (2006.01) |
| *C23C 16/505* | (2006.01) |
| *C23C 16/509* | (2006.01) |
| *H01J 37/32* | (2006.01) |
| *C23C 16/455* | (2006.01) |
| *C23C 16/44* | (2006.01) |

(52) U.S. Cl.
CPC ....... *H01J 37/3244* (2013.01); *C23C 16/4404* (2013.01); *C23C 16/45565* (2013.01); *C23C 16/45572* (2013.01); *C23C 16/45585* (2013.01); *C23C 16/50* (2013.01); *C23C 16/505* (2013.01); *C23C 16/509* (2013.01); *C23C 16/5096* (2013.01); *H01J 37/32091* (2013.01); *H01J 37/32449* (2013.01); *H01J 37/32477* (2013.01)

(58) Field of Classification Search
CPC ... C23C 16/50; C23C 16/505; C23C 16/509; C23C 16/45585
USPC ....... 118/723 E, 723 ER; 156/345.43–345.47
See application file for complete search history.

(56) References Cited

U.S. PATENT DOCUMENTS

| | | | | |
|---|---|---|---|---|
| 4,780,169 A | * | 10/1988 | Stark | H01J 37/3244 156/345.34 |
| 5,415,753 A | * | 5/1995 | Hurwitt | C23C 14/0068 204/192.12 |

(Continued)

FOREIGN PATENT DOCUMENTS

| | | | |
|---|---|---|---|
| JP | 05175135 A | * | 7/1993 |
| JP | 2000-232456 | | 11/2000 |

OTHER PUBLICATIONS

Y.Yang and M. Kushner (see 450-mm Dual Frequency Capacitively Coupled Plasma Sources: Conventional, Graded, and Segmente) Journal of Applied Physics 108, 113306, 2010).

(Continued)

*Primary Examiner* — Rudy Zervigon

(57) ABSTRACT

Proposed is a showerhead-cooler system of a semiconductor-processing chamber with uniform distribution of plasma density. The showerhead has a plurality of through gas holes that are coaxial with respective channels of the gas-feeding cooler plate. On the gas inlet side, the though passages of the showerhead are provided with unequal conical nozzles characterized by a central angle that decreases from the peripheral part of the showerhead to the showerhead center. Such design provides uniformity of plasma density. Furthermore, in order to protect the walls of the nozzle and the walls of the gas holes from erosion that may be caused by the hollow-cathode phenomenon, these areas are coated with a thin protective coating that is resistant to electrical breakdown and chemical corrosion.

11 Claims, 13 Drawing Sheets

(56) References Cited

U.S. PATENT DOCUMENTS

| | | | | |
|---|---|---|---|---|
| 5,439,524 | A * | 8/1995 | Cain | C23C 16/45565 118/715 |
| 5,500,256 | A * | 3/1996 | Watabe | C23C 16/45561 118/715 |
| 5,781,693 | A * | 7/1998 | Ballance | C23C 16/45565 118/724 |
| 5,792,269 | A * | 8/1998 | Deacon | C23C 16/45565 118/715 |
| 5,819,434 | A * | 10/1998 | Herchen | H01J 37/3244 156/345.34 |
| 6,024,799 | A * | 2/2000 | Chen | C23C 16/455 118/715 |
| 6,050,506 | A * | 4/2000 | Guo | C23C 16/455 239/558 |
| 6,059,885 | A * | 5/2000 | Ohashi | C23C 16/4401 118/715 |
| 6,079,356 | A * | 6/2000 | Umotoy | C23C 16/455 118/723 E |
| 6,080,446 | A * | 6/2000 | Tobe | C23C 16/34 257/E21.168 |
| 6,106,625 | A * | 8/2000 | Koai | C23C 16/455 118/715 |
| 6,132,512 | A * | 10/2000 | Horie | C23C 16/45565 118/715 |
| 6,250,250 | B1 * | 6/2001 | Maishev | H01J 37/32009 118/723 ER |
| 6,333,601 | B1 | 12/2001 | Wickramanayaka | |
| 6,381,021 | B1 * | 4/2002 | Somekh | G01N 21/55 356/445 |
| 6,410,089 | B1 * | 6/2002 | Guo | C23C 16/455 118/715 |
| 6,412,437 | B1 * | 7/2002 | Campbell | C23C 16/4409 118/723 E |
| 6,454,860 | B2 * | 9/2002 | Metzner | C23C 16/407 118/715 |
| 6,461,435 | B1 * | 10/2002 | Littau | C23C 16/455 118/715 |
| 6,565,661 | B1 * | 5/2003 | Nguyen | C23C 16/4557 118/715 |
| 6,586,886 | B1 * | 7/2003 | Katz | H01J 37/3244 118/723 E |
| 6,800,139 | B1 * | 10/2004 | Shinriki | C23C 16/409 118/715 |
| 6,942,753 | B2 * | 9/2005 | Choi | C23C 16/5096 118/715 |
| 7,008,484 | B2 * | 3/2006 | Yim | C23C 16/45565 118/715 |
| 7,270,713 | B2 * | 9/2007 | Blonigan | C23C 16/455 118/715 |
| 7,296,534 | B2 * | 11/2007 | Fink | H01J 37/32532 118/723 E |
| 7,390,573 | B2 | 6/2008 | Korevaar et al. | |
| 7,429,410 | B2 * | 9/2008 | Keller | H01J 37/3244 427/578 |
| 7,520,957 | B2 * | 4/2009 | Kao | H01J 37/32082 118/723 DC |
| 7,581,511 | B2 * | 9/2009 | Mardian | C23C 16/045 118/723 ER |
| 7,645,492 | B2 | 1/2010 | Gasworth | |
| 7,807,222 | B2 * | 10/2010 | Kuznetsov | C23C 16/045 118/715 |
| 7,829,145 | B2 * | 11/2010 | Balasubramanian | C23C 16/4405 427/255.28 |
| 7,926,446 | B2 | 4/2011 | Behle et al. | |
| 8,043,430 | B2 | 10/2011 | Dhindsa et al. | |
| 8,080,107 | B2 | 12/2011 | Kennedy et al. | |
| 8,083,853 | B2 * | 12/2011 | Choi | C23C 16/345 118/715 |
| 8,397,667 | B2 | 3/2013 | Behle et al. | |
| 8,628,619 | B2 | 1/2014 | Gasworth | |
| 9,224,581 | B2 * | 12/2015 | Mai | C23C 16/45565 |
| 2003/0207033 | A1 * | 11/2003 | Yim | C23C 16/45565 427/255.37 |
| 2003/0209323 | A1 * | 11/2003 | Yokogaki | C23C 16/45565 156/345.34 |
| 2004/0003777 | A1 * | 1/2004 | Carpenter | C23C 16/45565 118/715 |
| 2004/0035358 | A1 * | 2/2004 | Basceri | C23C 16/45514 118/715 |
| 2004/0058070 | A1 * | 3/2004 | Takeuchi | C23C 4/01 427/282 |
| 2004/0129211 | A1 * | 7/2004 | Blonigan | C23C 16/455 118/715 |
| 2004/0238123 | A1 * | 12/2004 | Becknell | H01J 37/32357 156/345.33 |
| 2005/0223986 | A1 * | 10/2005 | Choi | C23C 16/4405 118/715 |
| 2005/0251990 | A1 * | 11/2005 | Choi | C23C 16/345 29/558 |
| 2005/0255257 | A1 * | 11/2005 | Choi | C23C 16/345 427/585 |
| 2006/0005926 | A1 * | 1/2006 | Kang | H01J 37/32082 156/345.34 |
| 2006/0054280 | A1 * | 3/2006 | Jang | C23C 16/45565 156/345.34 |
| 2006/0060138 | A1 * | 3/2006 | Keller | H01J 37/3244 118/715 |
| 2006/0180275 | A1 | 8/2006 | Steger | |
| 2006/0228490 | A1 * | 10/2006 | Wang | C23C 16/45565 427/457 |
| 2006/0228496 | A1 * | 10/2006 | Choi | H01J 37/32449 427/569 |
| 2006/0236934 | A1 * | 10/2006 | Choi | C23C 16/345 118/723 R |
| 2008/0020146 | A1 * | 1/2008 | Choi | C23C 16/345 427/446 |
| 2008/0178807 | A1 * | 7/2008 | Wang | C23C 16/45565 118/723 R |
| 2008/0302303 | A1 * | 12/2008 | Choi | C23C 16/24 118/723 R |
| 2008/0305246 | A1 * | 12/2008 | Choi | C23C 16/45565 427/74 |
| 2010/0006031 | A1 * | 1/2010 | Choi | C23C 16/45565 118/723 R |
| 2010/0136216 | A1 * | 6/2010 | Tsuei | C23C 16/45559 427/9 |
| 2010/0252197 | A1 | 10/2010 | Kadkhodayan et al. | |
| 2010/0288197 | A1 * | 11/2010 | Choi | C23C 16/4404 118/723 R |
| 2010/0311249 | A1 * | 12/2010 | White | C23C 16/45565 438/758 |
| 2011/0290183 | A1 * | 12/2011 | Choi | C23C 16/345 118/723 E |
| 2012/0097330 | A1 * | 4/2012 | Iyengar | C23C 16/45565 156/345.34 |
| 2014/0165911 | A1 * | 6/2014 | Kao | H01J 37/32009 118/723 E |
| 2014/0283746 | A1 * | 9/2014 | Seo | C23C 16/4412 118/723 R |
| 2015/0040829 | A1 * | 2/2015 | Ramaswamy | H01J 37/32596 118/723 E |
| 2015/0214009 | A1 * | 7/2015 | Glukhoy | H01J 37/3244 239/132.3 |
| 2015/0214013 | A1 * | 7/2015 | Glukhoy | H01J 37/32449 29/527.1 |

OTHER PUBLICATIONS

Sansonnens and Schmitt (see L. Sansonnens and J. Schmitt, Appl. Phys. Lett. 82, 182, 2003).

Torch Inducator of Tekna plasma system http://www.tekna.com/technology/plasma-state/.

Brooks Instrument GF81 High-Flow MFS.

* cited by examiner

SHOWERHEAD-COOLER SYSTEM OF A SEMICONDUCTOR-PROCESSING CHAMBER FOR SEMICONDUCTOR WAFERS OF LARGE AREA

FIELD OF THE INVENTION

The invention relates to the field of semiconductor production, in particular to a showerhead-cooler system of a semiconductor-processing chamber with uniform distribution of plasma density. More specifically, the invention relates to a system of a showerhead with a gas-feeding cooler plate in which the showerhead is made from an electrically conductive material, e.g., silicon. The system of the invention is characterized by high resistance to deterioration and by high uniformity of plasma generated in the plasma-processing chamber between the showerhead and the object being treated, especially in plasma processing chambers for treating large-area objects where the size of the showerhead becomes approximately the same as the wavelength of the plasma-generating RF field.

DESCRIPTION OF RELATED ART AND BACKGROUND OF THE INVENTION

The fabrication of integrated circuits (IC) in the semiconductor industry typically employs plasma discharge, especially a capacitively coupled plasma (CCP) discharge, to create and assist surface chemistry within a processing chamber necessary to remove material from and deposit material onto a substrate. Wafer size continuously increases and after transition from 300 mm has already reached 450 mm in diameter. Therefore, the wafer surface area has increased by 2.25 times, and providing the required plasma density for the etching process becomes a problem.

For a 450-mm wafer, the scaling method that previously has been successfully used does not apply and needs some correction in order to compensate for the increase in RF generator power. This occurs because after exceeding some critical value, further increase of RF power will lead to extra high voltage and to electrical breakdown and arcing inside the plasma processing chamber. This drastically reduces reliability and cost of the system.

However, even though the RF power used for supporting the plasma etching processes is increased, in treating wafers of increased diameters, simple scaling of tools in accordance with Moor's Law can be used to some extent, taking into account similarity in design, technology, etc. One solution to this problem is based on the fact that an increase in frequency improves power coupling of the showerhead (as an electrode) with capacitive discharge. This, in turn, improves power coupling to the plasma. Plasma density also increases since plasma potential is increased. At the same time, sheath screening decreases. High-frequency excitation allows for obtaining much higher ion fluxes (i.e., plasma density) than the classical 13.56-MHz excitation at the same RF power.

However, at frequencies much higher than 13.56, the electromagnetic effects cause some problems that deteriorate the uniformity of plasma density. This nonuniformity may result mainly because of the following three factors: (1) the standing-wave effect that influences RF power deposition at the center of the plasma bulk; (2) an edge effect known as the "telegraph effect," which is caused by the reflection of RF power from the edges of the showerhead and is characterized by some plasma density perturbation in the vicinity of the edges; and (3) the skin effect, which enhances RF power deposition near the edges of the showerhead and tends to increase the local plasma density in the vicinity of the edges.

All of these factors cause drastic changes in distribution of plasma density and ion flux and eventually result in nonuniformity of etching. In other words, enhancement of uniformity is a key concern for transition to high-frequency excitation.

All current capacitively coupled plasma (CCP) tools are built on the principle of using dual frequency for separately controlling the amount of ions and radical fluxes on one hand, and, on the other hand, distribution of ion energy applied to the wafer. A reactive ion-etching system with dual frequency typically consists of a parallel-plate plasma-etching chamber where a CCP discharge is generated between an upper electrode or cathode and a lower electrode with a wafer. A conductive silicon wafer held by an electrostatic chuck is surrounded by a silicon focus ring and a dielectric outer ring. The wafer, the electrostatic chuck, and the focusing ring are combined into a wafer system. Both electrodes (cathode and wafer) are joined through matching networks to separate RF generators with frequency ratios from (10:1) to (10:5), where a higher-frequency generator is connected to the upper electrode (cooler plate), and another generator that operates at a lower frequency is connected to the wafer system through a blocking capacitor.

These two sources must be decoupled since the upper electrode operates at high frequency, e.g., 150 MHz, and the low electrode operates at low frequency, e.g., 13.56 MHz. FIG. 1 is a schematic transverse sectional view of a showerhead/cooler plate assembly that consists of a showerhead 20 and a gas-feeding cooler plate (hereinafter referred to as "cooler plate") 22, which when assembled is pressed against the showerhead 20. Due to a recess 24 machined on the surface of the cooling plate 22, a cavity is formed between the mating faces of the showerhead 20 and the cooler plate 22. In FIG. 1, reference numeral 26 designates a chuck that holds an object to be treated in a processing chamber (not shown), e.g., a semiconductor wafer W.

FIG. 2 is a three-dimensional view of the cooler 22 on the side opposite to the shower head 20 and facing the manifold head (not shown in FIG. 2) and contains a manifold pattern of radial grooves 22-1, 22-2, . . . 22-$n$ and concentric grooves 22'-1, 22'-2, . . . 22'-$m$.

FIG. 3 shows a view of the cooler plate 22 on the side 30 that faces the showerhead 20. The structure shown in FIGS. 1, 2, and 3 relates to a conventional plasma-treatment apparatus designed to treat 300 mm wafers. To provide uniform etching of the wafers with an outside diameter of 300 mm, the showerhead 22 should have a diameter of ~380 mm. Furthermore, the showerhead 22 should have a pattern of ~900 mm uniformly distributed through gas passages 30$a$, 30$b$, . . . 30$k$ (FIGS. 1 and 3) having diameters ranging from 1.0 to 1.5 mm.

As mentioned above, the scaling of tools in accordance with Moor's Law still applies to the transition from 300-mm wafers to 450-mm wafers with preservation of the same gas density per unit area but with transition to a showerhead that is drastically increased in size and becoming commensurable with the wavelength of RF power. In this case, however, for uniformity of plasma, the outside diameter of the showerhead should be increased as well in order to exceed diameters of the wafer and of the focusing ring. If the diameter of a showerhead is ~600 mm, the cooler plate 22 should have an outside diameter of 700 mm or more. The number of gas holes will grow up to 2,000 or more. Similar to the cooler plate used for processing 300-mm wafers in the Etching System TEL 300 of Tokyo Electron Limited (Japan), a new cooler plate 22a may comprise a perforated disk made from aluminum. The shallow radial grooves 22-1, 22-2, ... 22-n and concentric grooves 22'-1, 22'T-2, ... 22'-m formed on the side 22a of the cooler plate 22 serve to uniformly distribute the processing gas in radial and concentric directions before injection into the gas passages 30a, 30b, ... 30k (FIG. 3) that are formed on the bottom of these grooves and pass through the entire thickness of the cooler plate 22, terminating on the side 30 (FIG. 3) that faces the showerhead 20 (FIG. 1). As mentioned above, these gas passages usually comprise holes with diameters of 1.0 mm to 1.5 mm. If the number of gas passages in the conventional cooler plate is ~900, an increase in wafer diameter from 300 mm to 450 mm requires an increase in the number of gas passages by a factor of 2.75 to 3.

The recess 24 (FIG. 1) forms a gas reservoir for maintaining processing gas at a predetermined pressure that is controlled by gas flow controllers and valves (not shown). The pressure in the manifold determines the etching process in the processing chamber The cooler plate 22 also has an array of holes 36a, 36b, ... 36f for screws that attach the cooler plate 22 to the head of the showerhead and another array of holes 34a, 34b, ... 34f for screws that attach and press the cooler plate 22 to the manifold head of the entire upper electrode system. The manifold head (not shown) is insulated from the cooler plate 22 and is connected to an RF generator (not shown) through a matching network (not shown) that supplies RF power to the showerhead 20 (FIG. 1) through the cooler plate 22.

Because of the recess in the central part of the cooling plate that faces the showerhead, the RF power attained from the manifold head is uniformly distributed over the cooler plate 22 and is transferred to the showerhead 20 only through the peripheral part of the showerhead where both parts have ohmic contact.

In transition from wafers of 300 mm to wafers of 450 mm, the showerhead 20 (FIG. 1), which in the wafer processing apparatus functions as a cathode, also can be scaled to an increased diameter. The showerhead 20 comprises a perforated disk, the outside diameter of which will be increased when the 450-mm wafers increase in size from 380 mm to 600 mm. As usual, the showerhead 20 has a plurality of gas holes 38a, 38b, ... 38p (FIG. 1) that supply processing gas from the gas pressure reservoir 24 (FIG. 1) to the processing chamber. Bulk plasma is formed between the front side 20a of the showerhead 20 and the wafer W. However, the law of scaling will not be properly applied during transition to the 450-mm wafers; also, selection of the depth in the gas pressure chamber 24 (FIG. 1) becomes not so obvious and trivial as for the 300-mm wafers. More specifically, exceeding the threshold gap depth leads to the same instability that occurs when frequency exceeds rated value. Theoretically, all RF power is supposed to be delivered from the cooler plate 22 to the showerhead 20 through perfect ohmic contact at the periphery of both contacting parts, but in reality the force that presses the cooler plate 22 to the showerhead 20 by tightening the bolts 36a and 36b should be limited in order to prevent crushing of the very fragile silicon showerhead 20. Therefore, contact between the showerhead and the cooler plate must be taken into account. Furthermore, the polished contact surfaces at the periphery cannot be ideally even and may be contaminated. Therefore, in an actual application we should expect that some RF power can be lost and some gas may leak through the gaps. In order to stabilize the pressure in the gas pressure reservoir 24 (FIG. 1) of the cooler plate 22 and in the working space between the showerhead and the chuck, the diameter of the passages in the cooler plate should be selected with a predetermined ratio to the diameter of the showerhead gas holes. In other words, the showerhead should provide predetermined gas permeability that is represented by the total or regional gas flow through the gas holes and that can be expressed in terms of volumetric flow rate measured in conventional units, such as standard cubic centimeters per minute (sccm). In conventional showerheads, this permeability is uniform. Gas holes, which are drilled in the showerhead, are typically round holes, which may have diameters from 0.5 mm to 1.0 mm. The total number of gas holes is in the hundreds, e.g., up to 1,000 or more. Gas permeability in these passages can be adjusted by decreasing or increasing the number or the diameter of the holes, or both.

In order to provide uniform injection of processing gas from the gas pressure reservoir 24 to the plasma processing space, the gas-feeding passages 30a, 30b, ... 30k (FIG. 1) of the cooler plate 22 are generally aligned with the gas distribution holes 38a, 38b, ... 38p of the showerhead 20 (FIGS. 1 and 2), and their number is equal. Furthermore, as mentioned above, the passages 30a, 30b, ... 30k of the cooler plate 22 and the gas holes 38a, 38b, ... 38p of the showerhead 20 are arranged in a pattern of concentric circles in order to provide concentric and radial uniformity of gas distribution according to the geometry of the wafer W. In order to provide uniformity of plasma etching, both the showerhead 20 and the cooler plate 22 are round in shape, and their diameters are approximately 1.5 times greater than the diameter of the wafer to be treated.

The showerhead is made from a conductive, high-purity material such as a single-crystal silicon, polycrystalline silicon, or silicon carbide. A chemically reactive gas such as $CF_4$, $CHF_3$, $CClF_3$, $SF_6$ or mixture thereof with $O_2$, $N_2$, He or Ar is introduced into the plasma processing space and is maintained at a pressure that is typically in the range of milliTorrs.

It was found that the diameter of 0.5 mm for the gas holes is optimal for providing an indispensable gas flow rate and simultaneously reducing the influence of pressure in the gas reservoir on vacuum conditions in the processing chamber. On the other hand, since the diameters of the gas holes are small, in spite of the fact that a large amount of the holes is exposed to the processing side of the showerhead, the surface of the showerhead side remains relatively smooth, and uniformity of the plasma sheath, which is very sensitive to the surface condition of the processing side of the showerhead, is not deteriorated either by the matrix of holes or by surface roughness. As a result, due to the drop in pressure developed in the gas pressure reservoir 24 (FIG. 1) and in the processing chamber, the turbulent flow of processing gas through the gas-feed passages 30a, 30b, ... 30k of the cooler plate 22 is redistributed to a more static state and is converted to a laminar flow delivered to the plasma processing chamber at a relatively uniform rate.

It is generally required that passage dimensions and spacing be strictly controlled between gas holes of the showerhead used in the gas delivery system in order to provide uniform gas distribution on a particular surface area of the showerhead. The plasma that is used for etching semiconductor wafers is very corrosive. Naturally, a showerhead that is used in such a process is subject to the effect of very chemically corrosive gasses, especially when etching the wafers with highly reactive radicals, and therefore the showerhead is subject to deterioration by chemical corrosion. Moreover, heavy ions generated during plasma discharge bombard the sharp edges at the exits of the gas holes where electrical strength is very high. As a result, such exits are converted into craters, and this violates the etching process. Therefore, a showerhead is a consumable part that is supposed to be periodically replaced.

However, the showerhead is a very expensive item. Therefore, instead of replacing the entire showerhead, the eroded part on the processing side can be removed by re-polishing. After re-polishing, the processing side of the showerhead can serve two more additional terms. An electrical and mechanical contact between the cooler plate and the showerhead is provided through the periphery portions of both parts. In other words, RF voltage is applied to the periphery of the showerhead backside through ohmic contact. The rest of the showerhead backside surface does not have such contact because of the recess 24 (FIG. 1) formed in the cooler plate 22. Therefore, the central part of the showerhead 20 cannot transfer RF power. Thus, RF power is supposed to propagate from the edges in the radial inward direction to the center of the showerhead 20 through a thin layer on the processing side of the silicon-made showerhead. Generally, the surface resistance of silicon doped with boron is ~75 ohm·cm. Therefore, at a conventional frequency of 13.56 MHz, surface impedance allows the launching of electromagnetic waves into the plasma from the total surface of the showerhead rather than from the edges where the showerhead is electrically connected to the cooler plate.

For showerheads of relatively small diameters, e.g., those intended for processing 300-mm wafers and operating at low frequencies of RF power, e.g., 13.56 MHz, the transfer of power from the cooler plate 22 to the showerhead 20 through the edges, i.e., through the areas of contact between the cooler plate 22 and the showerhead 20, does not drastically affect uniformity of the plasma generated under the working face of the showerhead in the processing space of the plasma processing chamber. This occurs because the wavelength of RF power is much larger than the diameter of the showerhead, and in this case RF power uniformly propagates from the edges to the center and is transferred to the plasma discharge from the total surface of the showerhead into the conductive bulk plasma.

This discharge ionizes and dissociates the reactive gas that forms plasma, thus generating ions and chemically active radical particles. The ions strike the surface of the wafer to be etched by chemical interaction and momentum transfer. Because ion flow is predominantly normal to the surface of the wafer, the process produces the well-defined vertically etched sidewalls. The highly reactive radicals are not charged and have the ability to penetrate even the narrow and deep trenches in the wafer to provide etching there. An ion bombardment of energy is influenced by excitation in the plasma sheath adjacent to the wafer because low-frequency voltage is applied to the bottom of the chuck (lower electrode).

Thus, the level of power introduced into the system at low frequency provides control of coordinates and angular distribution of ion energy across the surface of the wafer. When high-frequency power is applied to the showerhead (upper electrode) from the cooler plate through the zone of contact with the showerhead, plasma density is controlled by high currents that are displaced more significantly toward the aforementioned zone of contact and increase the ohmic power transferred to the plasma and cause heating of the plasma sheath. In other words, under the conditions described above, RF power of high frequency is responsible for generation of ions and radicals. Because the system operates at dual frequencies, it becomes possible to adjust plasma density and ion bombardment energy separately.

RF power is supplied from an RF power supply unit through a matching network (not shown) and the cooler plate 22 to the backside 20b of the showerhead 20 (FIG. 1), specifically through the peripheral area of the latter (as mentioned above, the central part of the cooler plate 22 is occupied by the recess 24). The power is transmitted through the showerhead surface 20a to the plasma. When frequency increases, electrical field intensity at the central part of the showerhead working surface becomes higher than the electrical field intensity at the peripheral portion of the showerhead 20. Therefore, the density of generated plasma is higher at the central part of the processing space than at the peripheral part of this space. As a result, the uniformity of plasma density further deteriorates, which results in poor planar uniformity and charge-up damage to the plasma etching.

With the increase of showerhead size and much higher frequency requested to support the optimal level of plasma density for maintaining uniformity in dual frequency, capacitively coupled plasma-etching systems become more complicated because of the electromagnetic and finite wavelength effects that deteriorate this uniformity. The main source of plasma nonuniformity at an ultra-high frequency is the so-called "standing-wave effect."

At extra-high frequencies, RF power applied to the rear peripheral side of the showerhead is concentrated mostly at the edges and does not propagate to the center through the surface layer of the showerhead for entering the plasma. At these frequencies, impedance of a plasma sheath becomes less than the impedance on the surface of the showerhead.

Therefore, it is preferable to apply RF power directly to the plasma rather than first to the processing surface and then to the plasma. Thus, RF power enters directly into the plasma and more specifically into the plasma sheath in the vicinity of these edges. Once entering the plasma, the electrical field does not significantly penetrate the plasma bulk but appears to be wave-guided in the sheath.

As RF frequency increases, the plasma-effective wavelength decreases, and therefore the uniformity of the electrical field worsens. At 150 MHz, the size of the showerhead becomes comparable to or less than the wavelength of RF power propagated in the plasma. As mentioned above, at 150 MHz, the showerhead radius is larger than the quarter wavelength, and in this case the phase change of RF power from the edge to the center of the showerhead also becomes greater than the quarter wavelength. Moreover, transition to sufficiently high frequencies shortens the wavelength and leads to some constructive and destructive interferences and skin effects. Because of the constructive interference of counter-propagating waves from the opposite sides of the showerhead, the amplitude of the electrical field in the sheath increases at the showerhead center. This causes nonuniform distribution of plasma density, with plasma density higher in the center than at the edges. Therefore, depending on the frequency, the finite wavelength produces nonuniformities that are already problematic for 300-mm showerheads, and will become more critical for showerheads used in apparatuses treating wafers of 450 mm. Thus, at the frequency of 150 MHz, the transition occurs from a traveling wave to a standing wave. This phenomenon causes interference of the aforementioned wave with the counter-propagating waves reflected from the rear sides of the showerhead.

The electrical field launched by the RF power and plasma current introduced into the plasma becomes highly nonuniform with the amplitude of the electrical field in the plasma sheath increased at the center of the showerhead (electrode).

Several simulations made by different authors [see L. Sansonnens and J. Schmitt, *Appl. Phys. Lett.* 82, 182 (2003)] show that the electrical field is maximal at the center of the discharge and decays toward the edges, thus following the Bessel function. Such changes in RF power distribution result in nonuniform RF power deposition into plasma. As a result, the wafer treatment processes such as etching or deposition become nonuniform as well.

The local deposition of RF power in plasma that occurs near the edges of the showerhead and leads to increased local plasma density at the edges is referred to as the "skin effect."

For a CCP reactor with the geometry described above, argon plasma at the RF power frequency of 150 MHz (450 W) is sustained at a gas pressure of 50 mTorr. Under these conditions, ion flux density along the showerhead radius has the following values: the plateau around the center and to the radius of 50 mm of the showerhead has an ion flux density equal to $I=4.75 \times 10^{15}$ cm$^{-2}$ s$^{-1}$; the lower plateau in the area from the radius of 150 mm to the edge that has a total radius of 240 mm has an ion flux density $I=1.75 \times 10^{15}$ cm$^{-2}$ s$^{-1}$; and the linear downfall branch has an ion flux density I decreasing with radius R and expressed by the following formula:

$$I=4.75\times10^{15} \text{ cm}^{-2} \text{ s}^{-1}(1-bR),$$

where b is in the area with a radius from 50 mm to 150 mm at ~$2.75 \times 10^{-2}$.

FIG. 4 shows distribution of ion flow at frequencies of 13.56 MHz, 60 MHz, and 81.38 MHz for processes treating a 200-mm wafer. It can be seen that the ion flux drops almost by a factor of three at the edges as compared to the central area of the wafer. When at a high frequency the size of a wafer is doubled and the size of the cathode approaches the wavelength of the RF field, we can expect other effects that contribute to deterioration of scaling. Thus far, numerous suggestions have been proposed to provide uniformity of etching.

The article, "450-mm Dual Frequency Capacitively Coupled Plasma Sources: Conventional, Graded, and Segmented Electrodes" published by Yang Yang and Mark J. Kushner in the *Journal of Applied Physics* 108, 113306 (2010), presents results from a two-dimensional computational investigation of Ar plasma properties in a 450-mm DF-CCP reactor incorporating a full-wave solution of Maxwell's equations. The authors taught that finite wavelength effects followed by increase in frequency lead to collapse of electron density even in the plasma reactor for 300-mm wafer processing. The authors showed that in the center, in the intermediate portion, and at the edges of the electrode, the ion flux incident onto the wafer, ion energy, and angular distributions (IEADs) are different. It was suggested to solve the problem of plasma nonuniformity in the plasma-processing cavity by redistribution of RF power by providing graded conductivity electrodes with a multilayer of dielectrics. This dielectric coating changes the surface impedance that becomes less than the impedance of the plasma sheath in order to attract RF power and to return movement of RF power to the processing side of the showerhead. Thus, in order to enhance plasma uniformity, RF power is again redistributed on the processing surface of the showerhead in a specific order from the edges to the center of the showerhead. It is also stated that "segmentation of the HF electrode also improves plasma uniformity by making the electrical distance between the feeds and the sheath edges as uniform as possible."

In the above structure, the finite wavelength effect is lessened by decreasing the conductivity of the plasma-contacting surface of the electrode from the edge to center of the electrode by using a coating of dielectric material with a variable density. In this case, the RF wave can readily propagate through the surface of the showerhead dielectrics rather than through the plasma sheath, especially at the center of the showerhead having the lowest conductivity. Thus, the peak of electron density at the center is diffused and uniformity becomes smoother.

A drawback of this method is erosion and sputtering of the dielectric layer during the plasma process. As a result, plasma density distribution changes from process to process. Another drawback is contamination of the wafer by the sputtered material.

Other different methods to suppress the effect of electromagnetic waves were proposed. For example, Japanese Unexamined Patent Application Publication (KOKAI) No. 2000-323456 published on 11.24.2000, inventor A. Koshiishi, describes a plasma-processing device wherein the showerhead consists of two parts and the central part of the showerhead is made from a high resistivity material for consuming more RF power because of Joule heating. As a consequence, the electrical field intensity is reduced to a greater extent in the central part than at the peripheral portion of the showerhead. This effect is used for leveling the distribution of plasma density. However, the high resistivity part of the showerhead consumes too much RF power during Joule heating, and this reduces the efficiency of the device.

Another method to improve uniformity of ion flux onto a wafer is to use the so-called slot antenna. U.S. Pat. No. 8,080,107 issued to W. Kennedy, D. Jacob on Dec. 20, 2011 describes a showerhead that consists of two to six separate segments arranged in a ring configuration, such as segments of single-crystal silicon. But Yang Yang and Mark J. Kushner [see *Journal of Applied Physics* 108, 113306 (2010] suggested splitting the RF power and the power at these segments at different phases. At the segments, the phases of RF voltage alternate with 180°. The in-phase excitation retains the character of a surface wave propagating along the sheath and thus higher-density plasma is formed in the center. However, out-of-phase excitation shifts the maximum plasma density from the center to the mid-radius. This middle-peaked plasma density may lead to excitation of a higher order of waveguide mode in the chamber. As a result, it becomes more difficult to adjust the uniformity of plasma density.

A drawback of this method is a complicated, real-time control of plasma uniformity that includes tuning the phases by oscillating the phases of the segments or the phase swapping to shift the pick of RF power distribution from the center to the middle. The metal ceramic neighboring at the processing surface of the showerhead deteriorates the plasma sheath, and the resulting sputtering and erosion contaminate the product.

Sansonnens and Schmitt [see L. Sansonnens and J. Schmitt, *Appl. Phys. Lett.* 82, 182 (2003)] proposed to solve the problem of plasma-density nonuniformity by fabricating a Gaussian-shaped surface profile on electrodes covered with a thin dielectric plate to confine the plasma in a constant inter-electrode gap. In this proposal, a dielectric lens should have a Gaussian shape in order to receive uniform voltage across discharge and thus suppress the standing-wave effect. However, manufacture of the showerhead with an accurate and smooth curvilinear surface is an extremely complicated, inefficient, and expensive procedure.

There exist many other methods and devices for improving uniformity of plasma density distribution in the plasma-processing cavity of a CCP processing apparatus. However, in the majority of cases, these methods and apparatuses are aimed at solving the above-stated problem by managing the distribution of RF power.

It is understood in this regard that in transition to 450-mm wafer etching systems, the above methods and constructions are less efficient than methods based on controlling gas distribution. There exists a large number of gas holes of the same geometry in the showerhead for introducing processing gas from the gas reservoir to the plasma-processing chamber. The diameter of the gas holes is approximately 0.5 mm. The separation between the neighboring gas holes may vary from 5 mm to a greater distance. The gas flow through each hole is the same. However, changing the geometry at the exits of the holes on the processing side of the showerhead is not recommended (see, for example, U.S. Pat. No. 6,333,601 issued to S. Wickramanayaka on Dec. 25, 2001, "Planar gas introducing unit of a CCP reactor"). It is taught that with the increase in the gas-hole diameter to a value greater than 0.5 mm, the processing plasma will penetrate deeply into the hole and will increase erosion rate at the hole exit.

It is known that positive ions of plasma accelerate toward a showerhead surface and bombard this surface. These ions gain high energy, especially in vicinity of the sharp edges of the gas holes where density of the electrical field is high; thus, the bombardment of ions on the surface causes sputtering of this surface. According to this theory, the sputtering damage is higher at the exit of the gas holes since there is higher gas density and higher plasma density at these points. This process causes an erosion of the gas hole compared to the other areas of the showerhead, resulting in an enlargement in the diameter of the gas holes. With increased gas-hole diameter as a result of erosion, plasma tends to confine in the vicinity of the exit of these holes by multiple reflections of electrons from the walls of the gas holes. Accordingly, the erosion rate in the gas hole accelerates with the increase of plasma density. This process leads to the tapering of gas holes, and eventually the total processing surface of the showerhead should be re-polished.

In order to avoid degradation at the gas-hole exits, all gas distribution enhancing means for uniform plasma etching should be provided at the back side of the showerhead. A conventional method (by LAM® Research Corporation) is to divide the gas pressure reservoir into several separated zones. For example, as disclosed in US Patent Application Publication 20100252197 (inventors Babak Kadkhodayan and Anthony De La Llera; "Showerhead electrode with centering feature," published Oct. 7, 2010), the gas pressure reservoir is divided into two zones, where about 60% of the gas holes are in an inner zone and preferably about 40% of the gas holes in an outer zone. These zones are separated from each other by a gas sealing, such as an O-ring. Thus, the inner and outer zones above the wafer that undergo plasma etching can be fed with gas at different flow rates to optimize etch uniformity. However, during wafer processing, such as plasma etching, the showerhead and cooler plate are heated, and the difference in their thermal expansions places high loads on the O-rings. Besides a high temperature, the O-ring is also exposed to a highly corrosive etching gas. As a result, the O-ring material degrades, thus contaminating the etching process. Because processing gas leaks through the deteriorated O-ring, the pressure in each zone becomes out of control, and the etching process is deteriorated.

US Patent Application Publication 20060180275 A1 (Inventor Robert Stagger; published on Aug. 17, 2006) discloses a method of manufacturing gas distribution members for plasma-processing apparatuses. The method is based on combined control of gas distribution over different plasma zones with different plasma density to upgrade uniformity.

U.S. Pat. No. 8,043,430, "Methods and apparatuses for controlling gas flow conductance in a capacitively coupled plasma processing chamber," issued on Oct. 10, 2011 to R. Dhindsa, et al, discloses an apparatus for controlling flow conductance of plasma in plasma processing. The apparatus includes a ground ring that concentrically surrounds the lower electrode and has a set of slots formed therein, and a mechanism for controlling gas flow through these slots. However, the apparatus has a complicated structure, strict tolerances, and must be very carefully designed just for a single-process protocol. Another factor that causes nonuniformity of plasma treatment is deterioration of gas distribution channels that supply the processing gas from gas accumulation to plasma treatment through the showerhead.

However, since a showerhead surface is under high-voltage RF, the plasma treatment procedure is jeopardized by the highly destructive electrical processes. The plasma treatment chamber is supposed to work under heavy-duty conditions with intensive depreciation of materials. More specifically, instabilities in the RF circuit that are caused by many reasons may lead to generation of very high frequency in RF power. Impedance of the gas reservoir is drastically reduced, and the RF power with extra-high frequency prefers to propagate from the cooler plate to the showerhead through gaseous gaps and through the gas reservoir rather than through the ohmic contact surface on the periphery. A valuable part of energy is diverted by this capacitor-type resistance from the ohmic resistance at the periphery. The gas in the reservoir is also susceptible to electrical breakdown. A corona discharge and arcing also occur in this area. Further, the above-described abnormal conditions lead to a phenomenon that is known as a hollow cathode discharge, which occurs on the developed surfaces at the entrances to the aforementioned gas passages and penetrates inside the gas holes. This leads to the loss of power and distortion of the passage geometry, and, hence, to instability in technological parameters of the process. Under the effect of the hollow cathode discharge, in the worst case the gas flow becomes totally ionized or becomes the carrier of the charged particles that are introduced into the processing plasma and can be converted into miniature arcs. The arcing overheats the inner part of the holes of the exit areas and changes the structure of silicon. This leads to drastic lowering of the resistance of silicon to sputtering and etching. The heavy ions that are generated in the processing plasma bombard and sputter the overheated edges of the gas channels. They even develop craters that may reach 3 mm in depth or more.

Radicals penetrate into the passage deeper than ions and expand the initial diameter of the channel two to three or more times. In other words, it can be assumed that the aforementioned degradation of surface of the showerhead that faces a plasma discharge in the etching process can be explained by interaction of the charged particles and radicals on the plasma-surface boundary of the showerhead.

A source of deterioration of the showerhead surface is ionization of a gas flowing through each gas hole that is capable under some conditions to generate its own plasma discharge. Such a discharge, in turn, generates ions that bombard the passage wall. Moreover, for mismatching of impedances of the RF power supply with the processing system, the ionized gas flow can be easily converted into an arc. Such a mismatching may be caused by variations in chamber pressure, RF power, etc. In this case, a high-temperature torch that occurs at the exit of a gas hole causes thermal erosion on the surface of the showerhead and funnels the gas holes by creating a nozzle effect in the vicinity of the border between the exit of the passage and bulk plasma. Consequences of this effect are aerodynamic expansion, turbulence of gas ejected into the chamber, deterioration of uniformity of a plasma density, and contamination of the processing chamber, especially, the periphery of the showerhead by deposition of the product of erosion.

On the other hand, a corona discharge that causes arcing occurs in the gap on the gas input edges of the gas supply channels, i.e., on the side of the showerhead that faces the cooler plate. This arcing leads to destruction of the showerhead and, hence, to nonuniform distribution of processing gas in the plasma cavity, as well as to contamination of processing gas and of the product with particles of the showerhead material.

It should be further noted that the deterioration described above is not uniform and has a different degree in different areas of the showerhead. For example, gas-directing passages located closer to the periphery of the showerhead deteriorate faster and at a greater degree than in the center of the showerhead. This leads to shortening of the channel lengths in the peripheral part of the showerhead, which leads to decrease in gas pressure in the space in the peripheral areas of the processing chamber. This, in turn, leads to the nonuniformity of plasma.

SUMMARY OF THE INVENTION

The present invention relates to a deterioration-resistant system of a showerhead with a gas-feeding cooler plate (hereinafter referred to as "system") for use in a semiconductor-processing chamber that provides uniform distribution of plasma density in the working cavity of the semiconductor-processing chamber over the surface of a semiconductor wafer having an increased diameter, e.g., up to 450 mm. It has been found that etching of large-diameter wafers, e.g., of 450 mm in diameter, in a CCP plasma-treatment apparatus requires that for generating plasma of sufficiently high density a high RF power generator with the power of up to 25 kW with appropriate high-voltage accessories and isolation be used. Furthermore, desired plasma density can be obtained with transition to a frequency as high as 150 MHz. However, such high frequencies adversely affect distribution of plasma density and lead to nonuniformity of etching. In plasma-treatment apparatuses of the aforementioned type, plasma density depends on the radius of the showerhead, which is maximal at the center of the plasma bulk, minimal at the periphery, and linearly decreases in the intermediate part toward the periphery.

The deterioration-resistant showerhead-cooler system of the invention comprises a part of a CCP-type plasma treatment apparatus that is provided with a wafer-holding chuck, e.g., an electrostatic chuck, that holds a silicon wafer to be treated by the plasma-etching discharge. The wafer is surrounded by a focusing ring that serves as a guardian electrode to prevent turbulence of plasma at the edges of the wafer (wafer-edge effect) that may deteriorate uniformity of etching. Due to the use of such a focusing ring, uniformity of etching on the edges of the wafer is almost the same as in the center. However, this part of the apparatus is beyond the scope of the present invention.

This invention is devoted to the showerhead-cooler system that comprises a showerhead and a gas-feeding cooler plate that has gas-feeding channels that direct the gas to a showerhead through a gas-accumulation reservoir formed between both parts.

The showerhead has a showerhead body made of an electrically conductive material, e.g., silicon that is provided with a plurality of gas holes. These passages are coaxial to the respective gas-feeding passages of a cooler plate that is located above the showerhead. The peripheral part of the cooler plate is precisely polished in order to provide tight electrical contact with the peripheral area on the facing surface of the showerhead for transmitting RF power to the latter. The tight contact between both parts also serves as a seal for the aforementioned gas-accumulation reservoir that formed between the showerhead and the cooler plate. The cooler plate has a plurality of gas-feeding passages, the number of which is the same as the number of the gas holes in the showerhead. The gas holes of the showerhead are coaxial with the gas feeding passages of the cooler plate.

The system of the invention is suitable for plasma treatment of 300-mm wafers as well, but it can be most advantageously used for uniform plasma treatment of semiconductor wafers having a diameter of 450 mm, i.e., the wafer size to which the semiconductor industry is gradually transferring at the present time.

For example, a showerhead intended for plasma treatment of a 450-mm wafer may have a diameter of 500 mm to 600 mm and a thickness of ~10 mm, with the number of gas holes as high as 2,000, typically 1,800. The passages may have a diameter of 500 µm and are intended for dividing the gas flow that passes through the showerhead into a plurality of small gas flows. These small gas flows should be uniformly ejected into the plasma-processing space between the lower processing surface of the showerhead and the surface of the wafer, where in the presence of the electromagnetic field applied to the processing gas delivered to the aforementioned space a capacitively coupled RF plasma discharge called "bulk plasma" is formed. A high level of uniformity of plasma density distribution and, in consequence, uniformity in density of ion flow and radicals responsible for the plasma process are provided due to the dense distribution of the uniform gas-feeding holes of the showerhead.

In the system of the invention, the showerhead and the electrostatic chuck with the wafer and the focusing ring function as electrodes. In other words, when RF power is applied to the showerhead, these components form a capacitor with the electrodes in which the plasma discharge is generated due to an initial electrical breakdown and due to acceleration of seed electrons in the electrical field of this capacitor.

In the system of the invention, uniformity of plasma density is achieved by providing gas holes of the showerhead with a special geometry that makes it possible to adjust gas permeability of the showerhead. In other words, at uniform permeability of the showerhead, plasma density is changed in the radial direction of the showerhead and is maximal at the center of the showerhead, minimal at the periphery, and linearly decreases in the intermediate area.

On the back side of the showerhead, i.e., on the side facing the cooler plate, the gas holes are modified and are converted into conical nozzles. Patterns of the gas holes are divided into a plurality of zones, three in the system illustrated below in the detailed description of the invention, with the highest permeability at the periphery, linearly increased permeability at the middle toward the periphery, and the lowest permeability at the center.

On the inlet side of the gas holes, i.e., on the side of the showerhead that faces the gas-accumulating reservoir, the gas holes are modified into the aforementioned conical nozzles that have a funnel shape formed, e.g., by machining with commercial conical cutters (of 30°, 45°, 60°, 90°, and 120°) as countersinks on the gas inlet side of the showerhead. In the radial direction of the showerhead, the nozzles extend from the peripheral part of the showerhead to the center of the showerhead, but, if necessary, some gas holes in the central part of the showerhead may remain intact, i.e. without formation of the conical nozzles.

The geometry of the conical nozzles is defined by cone angles of standard countersinking cutters with gradual decrease of the angles from the peripheral area to the center of the showerhead, i.e., these angles depend on the radial distances from the showerhead center.

However, on the processing side of the showerhead, the profiles of the gas holes remain unchanged, i.e., the same as in conventional TEL 300 or TEL 450 showerheads.

The inventors herein have found that the following dependence exists between the cone angle θ, radius D, passage depth $I_H$, and passage diameter $d_H$:

$$(1+bR) = [1 - 1/\{1 - [(2I_H \tan \theta)/d_H]^4\}]^{-1/2} \quad (1)$$

where "b" is a coefficient that depends on power source frequency, pressure in the plasma, type of processing gas, etc. For each specific design of the system and parameters of the plasma process, in formula (1) the coefficient "b" and values of $I_H$ and $d_H$ are constant, and the angle θ depends only on radius R.

The passage geometry described above will improve uniformity of gas flow from the center to the peripheral zone and linearly through the intermediate zone, while the gas flow through the central zone will stay unchanged. Such modification enriches plasma density proportionally with RF power losses and results in smoothening the density of the ion flux responsible for uniformity of etching.

However, the geometry of some large countersinks (nozzles) may increase the depth of an antibreakdown gap between the cooler plate and the showerhead, thus violating Paschen's Law. This leads to appearance of microarcs in the gas reservoir and to ionization of the highly reactive etching gas. Therefore, the aforementioned gap size should be reduced to keep the electrical breakdown voltage needed to cause an arc to be relatively high. If this gap exceeds its original value because of the drilled nozzles, the voltage required to cause an arc will be less than threshold and probability of arcing will increase. Moreover, such an initial microarcing may have a dramatic response because of the phenomenon known as parasitic "hollow cathode discharge" which responds to the microarcs. This discharge appears on the back side of the showerhead and may be a source of degradation of the working side that faces the wafer. In other words, since the gas holes are modified, in the presence of electrical fields used, for example, during plasma launching, the hollow cathode discharges may be triggered within these gas holes, especially in the nozzles. In plasma-processing operations, such hollow cathode discharges may lead to plasma power loss and generation of particles as products of erosion of the showerhead material. A parasitic plasma discharge can occur on the side walls of the nozzles as well as at the entrances of the gas holes.

Thus, the parasitic hollow discharge is triggered by microarcs that appear at instabilities and is formed during the above-described processes on the back side surface of the showerhead, especially on the sharp edges at the entrances to the gas holes. The nozzles increase this risk at a greater degree.

Electrons generated by this discharge can oscillate inside the cavity of the conical nozzle. The oscillating electrons cause multiple ionization, thereby generating dense parasitic plasma. The RF-powered parasitic hollow discharge originates ions that can bombard the surface of the nozzle. This bombardment causes a secondary electron emission and heating of the surface with thermal electron emission that contributes to the total electron density and further enhances the hollow cathode discharge. Moreover, charged particles generated by the hollow cathode discharge carried along the gas passages together with the gas flow can penetrate through the gas holes into the processing plasma, and this causes a local enrichment of the plasma density in the vicinity of the outlet of the gas holes that attract the high-energy ions from the bulk plasma during the half-cycle when the showerhead becomes negative to the plasma bulk. The bombardment of the edges at the exit of the gas holes by these ions develops craters that can be 2 to 3 mm deep. Products of erosion deposited on the surface of the showerhead contaminate the wafer.

In accordance with the present invention, the above problem is solved by coating the back side of the showerhead, especially the entrance into the nozzle, the throat of the nozzle, and even partially the inner surface of the gas holes, with a protective coating resistant to electrical breakdown and chemical corrosion. In addition to corrosion resistance, this coating should withstand thermal cycling during the plasma-etching process when the temperature of the showerhead is increasing up to 800° C. The inventors herein have found that a coating material that can withstand the above-mentioned severe condition is, e.g., silicon carbide or yttrium oxide ($Y_2O_3$). In the system of the invention, the silicon carbide or yttrium oxide coating may have a thickness ranging from 2 microns to 5 microns.

Since the above-described geometry of gas holes with nozzles on the inlet side is inapplicable without the use of a protective coating that is resistant to electrical breakdown and chemical corrosion, such a coating must be considered as an indispensable part of the present invention.

Furthermore, a conical nozzle facilitates manufacturing and provides flexibility in converting the existing design to one with a higher flow rate without major redesign. Such geometry can be easily performed using countersink drill bits, e.g., with a 20° to 120° convergent angle.

The narrow end of the nozzle comprises a nozzle throat that has the same cross-section as the gas hole of the showerhead and has the same diameter $d_2$ that ranges from 0.5 mm to 1 mm, while at the entrance end on the back surface of the showerhead the nozzle may have a diameter $d_3$ that is one and one-half to four times greater than the diameter $d_2$. However, the diameter $d_3$ must be limited by the contours of the neighboring nozzles on the back side of the showerhead. In other words, the sum of radiuses of the neighboring nozzles on the back side of the showerhead should not exceed the distance between the central axes of the neighboring gas holes. The angle θ of the nozzle convergent cone section may range from 0 to 120°.

The function of the nozzle is to act as a convertor of slow gas flow in the gas-accumulating reservoir into a high-velocity gas flow through the gas hole. The flow of gas through the nozzle is driven from the high pressure $p_1$ developed in the gas-accumulating reservoir at the nozzle entrance toward the low static pressure $p_2$ in the processing chamber. The flow through the nozzle is different from the flow through the conventional gas hole because of a gradual decrease in nozzle diameter, whereby the flow rate through the nozzle may be approximately 2.75 times higher than the flow rate through a nontapered gas hole.

Such behavior of gas flow can be simply explained. The geometry of a conventional nontapered gas hole has a limited acceptance of gas flow from the gas reservoir. It accepts just a central part of the gas flow that is ejected from a gas passage of the cooler plate perfectly aligned with the respective gas hole. Such gas flow that is directly aimed at the gas hole is called "core flow." The core flow has a velocity vector normal to the surface of the back side of the showerhead. If a velocity vector is different from normal, the probability of penetration of gas molecules into the gas holes is reduced. But funneling of the entrance of the gas holes on the showerhead back side can increase such acceptance for gas molecules of the flow. Moreover, gas flow can be controlled by the geometry of the nozzles. Apparently we can divide the gas in the gas reservoir into three layers A, B, and C according to the distance from the back side of the showerhead. The molecules of these layers have different probabilities for entering the gas holes as compared with core flow. However, if the entrance of the hole has a nozzle, the geometry probability will be increased according to the cone angle of such nozzle. Thus, if the angle of the nozzle is close to zero, only the core flow can penetrate the hole. At an angle of ~20°, the cross-sectional area of the nozzle increases, and a part of gas in the bottom layer A that is close to the surface of the nozzle acquires a higher probability of entering the hole together with the core flow. If the angle of the nozzle is increased to 60°, gas molecules from the intermediate layer B will have a probability of approaching the entrance of the hole and will have passage through this hole together with the core flow and the flow through layer A. Next, at angle 120°, the cross-sectional area is so large that gas molecules from layer C, which is the most distant from the surface of the showerhead, can be transported through the hole together with molecules of the core flow and the flow from layers A and B, thus increasing total flow rate. Now, permeability of the showerhead will be nonuniform and can be controlled from the center to the periphery according to a linear as well as nonlinear law.

Let us assume that gas flows downward through a hole having a cross-sectional area $A_1$ with a velocity $V_1$ and that the flow encounters a change when passing through the cross-sectional area $A_2$ of the throat. In this case, the gas velocity is changed in accordance with the following formula:

$$V_2 = [1-(A_2/A_1)^2]^{-1/2}[2(p_1-p_2)/\rho]^{1/2} \quad (2)$$

where $\rho$ is gas density.

Since mass flow rate M is a product of gas density, flow area, and velocity, the following can be written:

$$M = \rho A_2 V_2 \quad (3)$$

Because flow areas are proportional to their diameters in the power of two, and because the diameter at the nozzle entrance can be presented as $$d_1 = d_H + 2I_H \tan\theta \quad (4)$$

where $I_H$ is depth of the convergent profile, $d_H$ is diameter of the passage, and $\theta$ is a semicone angle of the nozzle, mass flow rate can be presented as follows:

$$M = [\pi(d_H)^2/4][1-1/\{1-[(2I_H \tan\theta)/d_H]^4\}]^{-1/2} [2\rho(p_1-p_2)]^{1/2} \quad (5)$$

In order to enhance uniformity of ion flux density, the mass flow is supposed to be changed as a function of radius of the showerhead:

$$M_R = M_0 + M_0(1+bR) + M_{max} \quad (6)$$

where $M_0$ is minimal mass flow rate for the area of the showerhead where $\theta=0$ no nozzle) from radius 0 to 50 mm, and $M_{max}$ is maximal mass flow rate with $\theta_{MAX}=60°$ for the area from radius R=150 mm to R=280 mm and b=2.75× $10^{-2}$.

In the intermediate area from R=50 mm to R=150 mm, the nozzle angle $\theta$ is a function of radius R and can be found from the following expression:

$$(1+bR) = [1-1/\{1-[(2I_H \tan\theta)/d_H]^4\}]^{-1/2} \quad (1)$$

A nozzle is usually made long enough such that the pressure in the reservoir is reduced at the nozzle throat to the pressure existing inside of the gas holes.

The present model is based on the fact that the converging nozzle operates steadily, thus the stagnation conditions of pressure and temperature in the gas-accumulating reservoir or the plasma chamber upstream of the converging nozzle are homogeneous and continuous.

If there were no cone-shaped nozzles, penetration of gas into the gas holes would have been performed under conditions of sharp, local pressure change. In opposite, the nozzle facilitates smooth entrance of gas molecules from the larger area of the reservoir and contracts this flow. In order to control the gas flow through the nozzles with a conical entrance, angle $\theta$ must be variable in the radial direction of the showerhead. This is necessary because the radial velocities of gas decrease to the center and in the center will be equal to zero. Thus, for the system of a 450-mm wafer, angle $\theta$ may be equal to zero in the central area, i.e., in the area of the showerhead from the center upward to R about 50 mm where RF power is maximal. At the same time, angle $\theta$ should be linearly increased from $\theta=0$ to $\theta$ about 120° in the area with R between 50 mm to 150 mm, and should be equal to 120° in the area with R of ~150 mm to ~240 mm where RF power is minimal. Such geometry will change radial distribution of the gas flow injected into the plasma bulk.

As a result, it will be possible to intensify ionization around the periphery of the showerhead as compared to the center where the gas flow remains unchanged and to smoothly increase ionization in the intermediate area. Thus, it becomes possible to adjust the distribution of plasma density to a uniform level across the entire showerhead.

In a plan view of the showerhead, the passages having the countersinks of the same geometry are arranged circumferentially on a common circle and with an equal pitch from each other. In order to prevent overlapping, the sum of radiuses of the neighboring countersinks should not exceed the distance between the central axes of the neighboring passages. At the same time, the maximal depth L of the countersinks also must be taken into account for possibility of subsequent refurbishing by re-polishing the surface of the showerhead on the gas inlet side. This is important in view of the high manufacturing cost of the showerhead. As the showerhead is re-polished, the thickness of the showerhead decreases, and the throat of the nozzle approaches the processing surface. As a result, creation of the positive potential in the course of the RF cycles may cause leakage of electrons from plasma into the gas-accumulation reservoir, and this is undesirable for the following reasons.

All RF power should be delivered to the showerhead. However, some current leaks from the zone of contact of the cooler plate with the showerhead to the gas-accumulation reservoir, which serves as a capacitive resistor. However, this reservoir is very sensitive to any instability in the RF circuit, such as local impedance fluctuations caused by microarcs in the chamber and deviations in geometry of the reservoir from the ideal shape, e.g., separation of insulation coating from the chamber walls, etc. Some instabilities, such as mismatching, are expected and are taken into account during design of the recess due to the fact that capacitive resistance of the gas gap remains very high even at high fluctuations of RF circuit parameters.

The distance between the upper surface of the showerhead and the upper wall of the gas-accumulating reservoir, i.e., the thickness of the gas layer, can be determined by Paschen's Law so as to prevent occurrence of the discharge. However, presence of the gas holes violates the above condition of the discharge absence. Therefore, the launching of plasma in the presence of a high-voltage electrical field may trigger a hollow cathode discharge in the gas-accumulating reservoir, especially in the nozzle area. In plasma processing, these hollow cathode discharges may lead to plasma power loss and generation of particles as a result of erosion of the showerhead material. It is understood that such plasma discharges in the nozzle area and inside the gas-feeding passages are parasitic and extremely undesirable since, as mentioned above, they may contaminate the plasma and, hence, the wafer.

In order to prevent the adverse effect of the hollow cathode phenomenon, the inventors herein offer to prevent the erosion of the nozzle and passage surfaces by coating these surfaces with a plasma-resistant coating. It has been experimentally found that coating with a thin film of silicon carbide or yttrium oxide is the best selection for accomplishing the above goal.

DETAILED DESCRIPTION OF THE INVENTION

Figure 4:
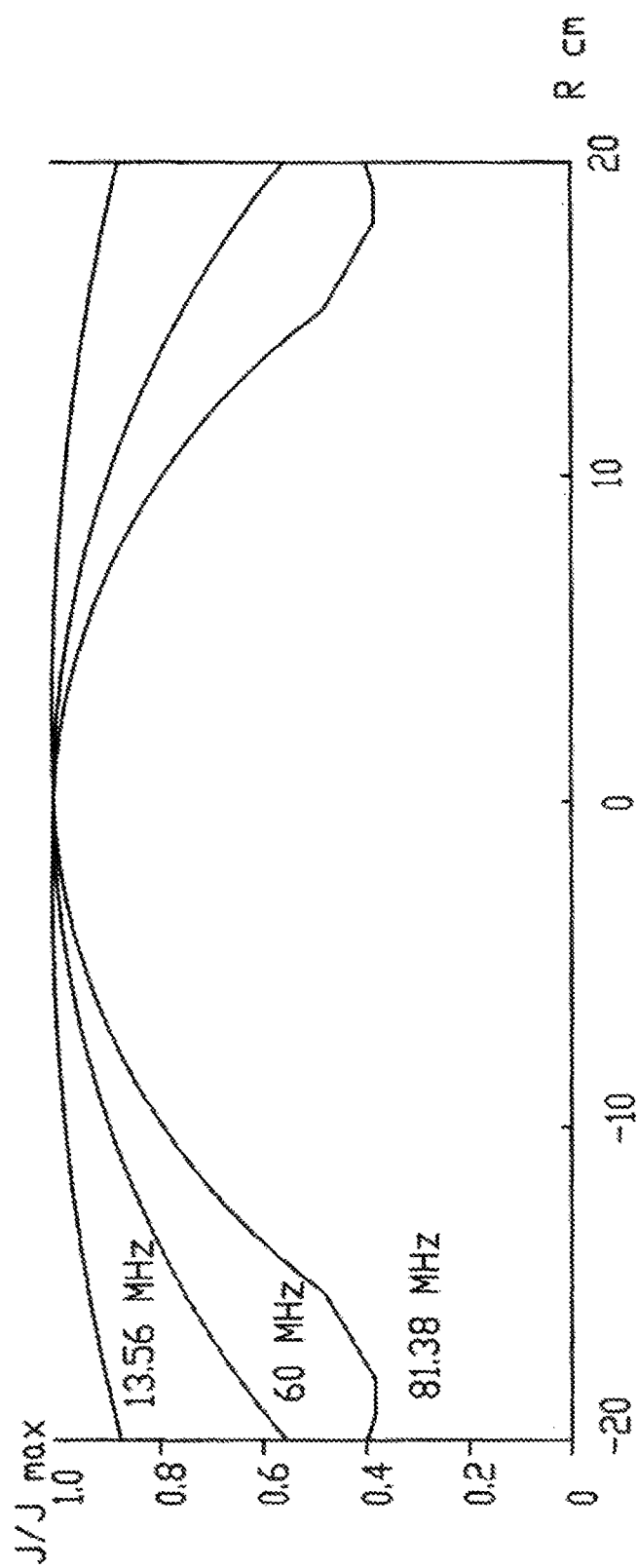
FIG. 4 is a graph that shows distribution of ion flow at frequencies of 13.56 MHz, 60 MHz, and 81.38 MHz for processes treating a 200-mm wafer; it can be seen that ion flux drops almost with a factor of three at the edges as compared to the central area of the wafer.

The present invention relates to a deterioration-resistant showerhead-cooler system of a semiconductor-processing chamber with uniform distribution of plasma density that includes a system of a showerhead with a gas-feeding cooler plate (hereinafter referred to as "system") for use in a semiconductor-processing chamber that provides uniform distribution of plasma density in the working cavity of the chamber over the surface of a semiconductor wafer having an increased diameter, e.g., up to 450 mm. It has been found that etching of large-diameter wafers, e.g., 450 mm in diameter, in a CCP plasma-treatment apparatus requires that for generating plasma of sufficiently high density, a power source of very high frequency up to 150 MHz be used. However, such high frequencies adversely affect distribution of plasma density and lead to nonuniformity of etching. In plasma-treatment apparatuses of the aforementioned type, plasma density depends on the radius of the showerhead, which is maximal at the center of the plasma bulk, minimal at the periphery, and linearly decreases in the intermediate part toward the periphery. As mentioned above, such radial nonuniformity of plasma density caused just by the standing-wave effect is shown in FIG. 4 as theoretical dependence of the aforementioned ion flux distribution responsible for the plasma etching from the frequencies. However, such decay toward the edges can be corrected by the distribution of the gas flow proposed by the authors.

Figure 5:
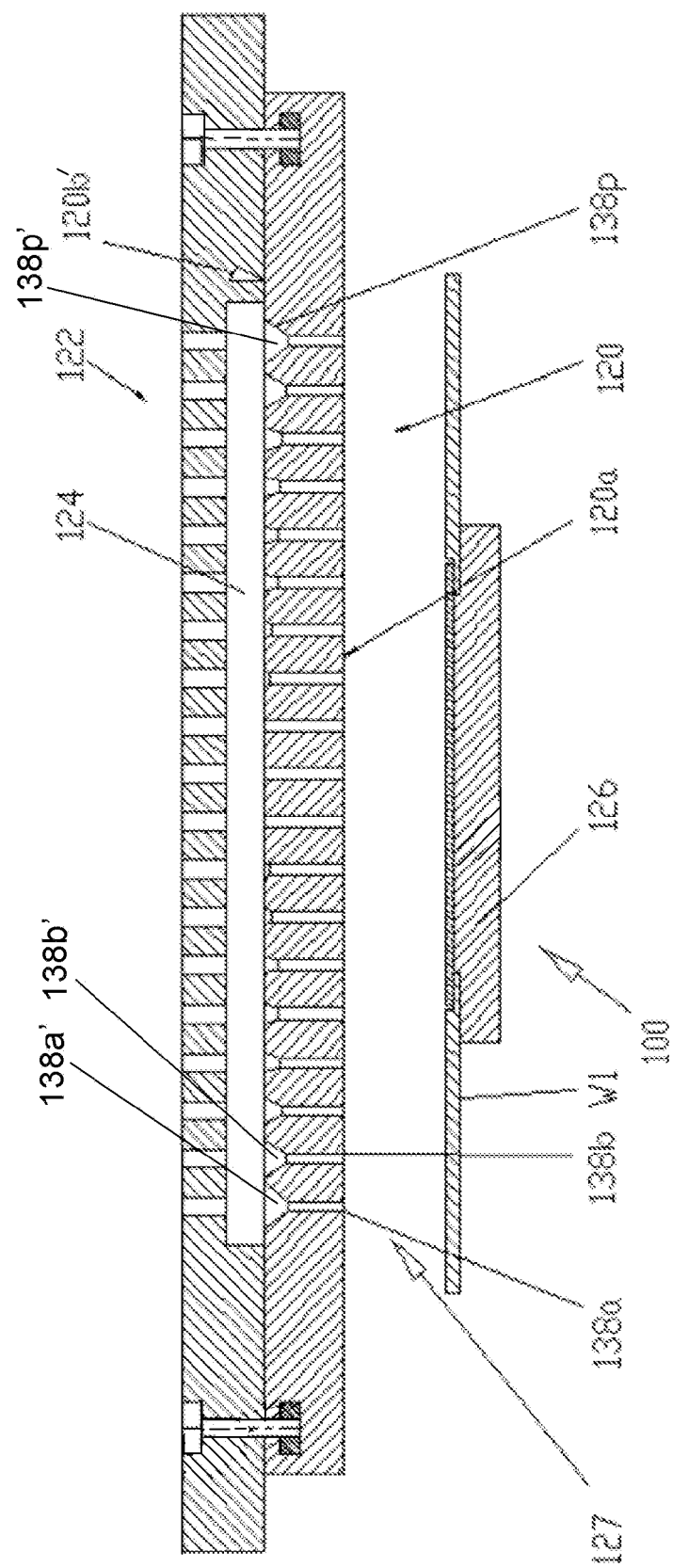
FIG. 5 is a sectional view of the showerhead/cooler plate system of the present invention.

A "showerhead/cooler plate system" of the present invention, which as a whole is designated by reference numeral 100, is shown in FIG. 5, which is a transverse sectional view of the system. As shown in FIG. 5, similar to the conventional showerhead/cooler plate system shown in FIG. 1, the system 100 consists of a showerhead 120 and a cooler plate 122, which in an assembled state of the unit is pressed against the showerhead 120, with a gas cavity 124 formed between the mating faces of the showerhead 120 and the cooler plate 122. In FIG. 5, reference numeral 126 designates a chuck that holds the object to be treated, e.g., a semiconductor wafer W1, in a processing chamber 127, only a part of which is shown in FIG. 5 and which is maintained under a vacuum.

Figure 2:
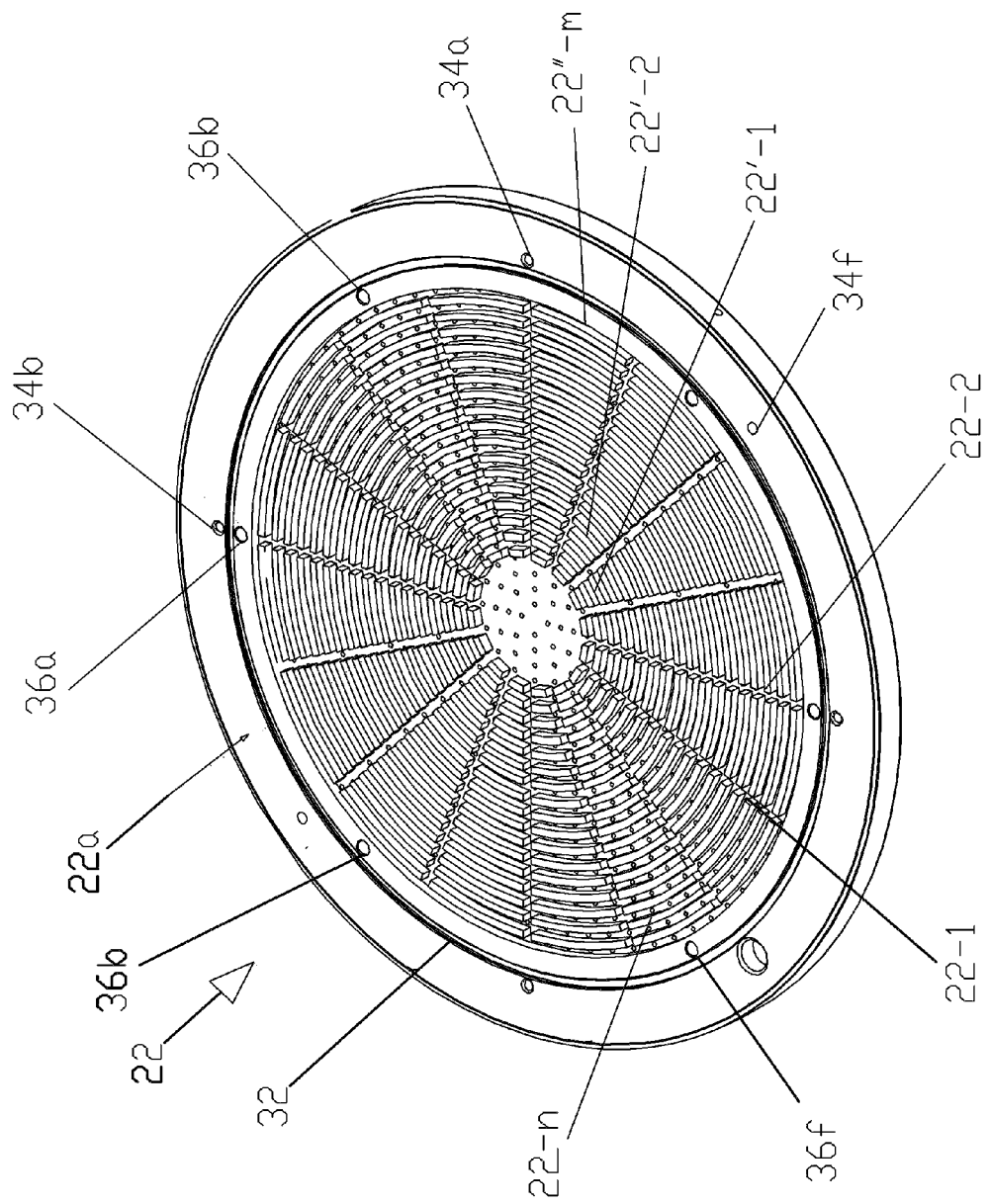
FIG. 2 is a three-dimensional view of the cooler plate with a view on the side that faces a manifold head (not shown) and therefore contains a manifold pattern of radial and concentric grooves.
Figure 3:
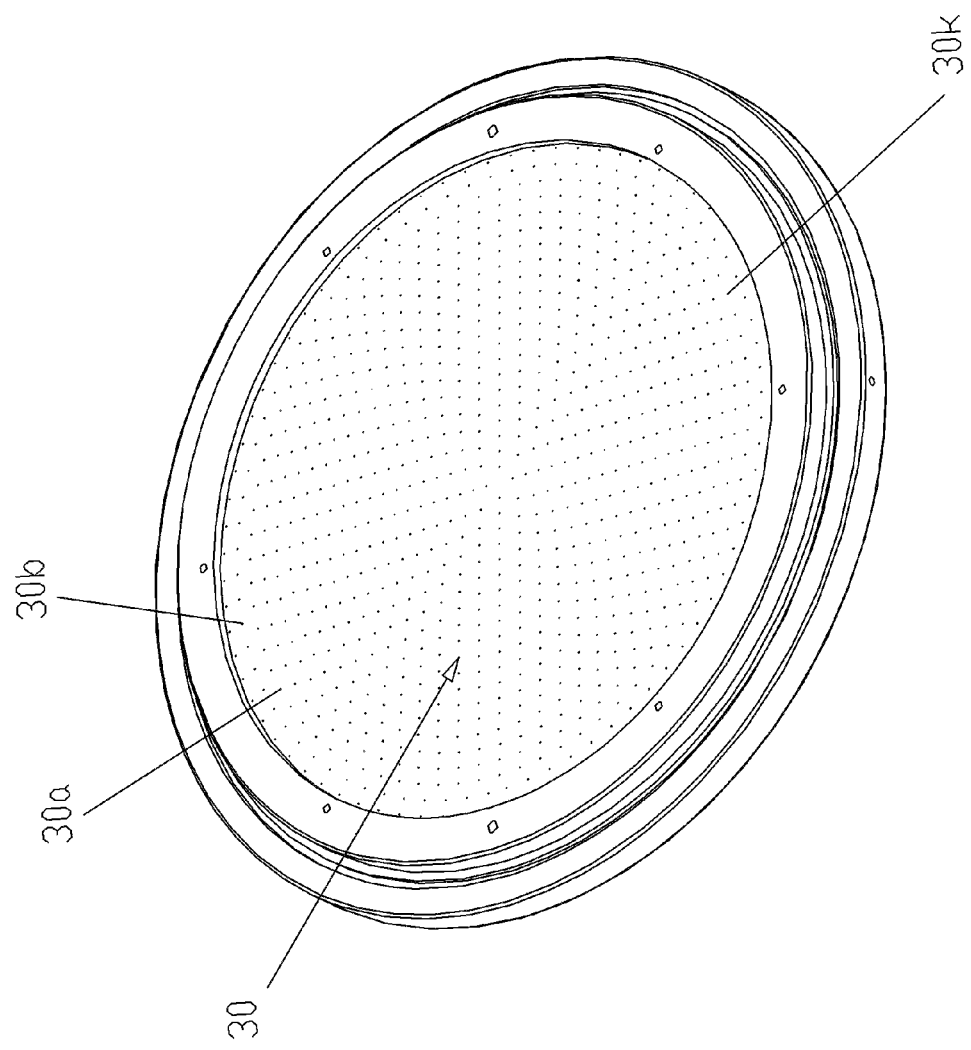
FIG. 3 is a view of the cooler plate on the side that faces the showerhead.
Figure 6:
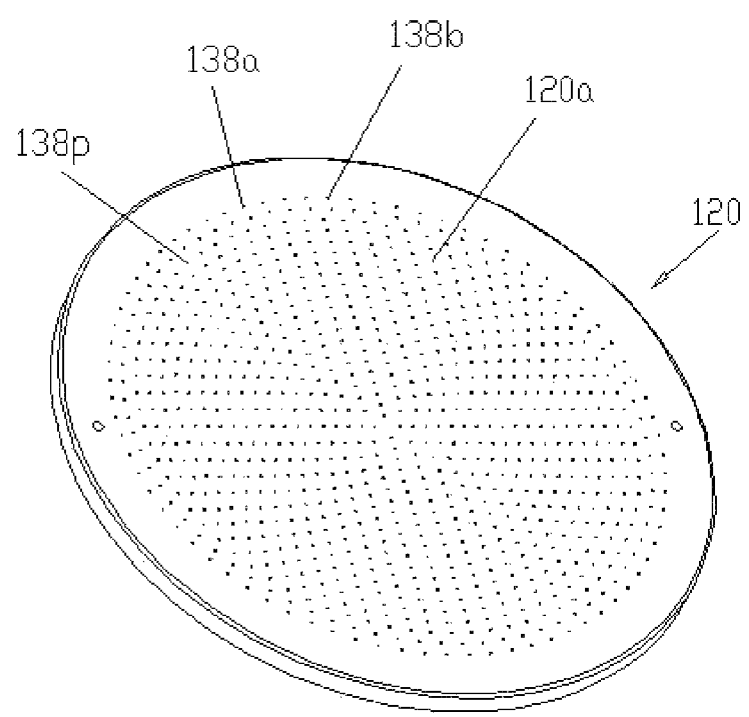
FIG. 6 is a top view of the showerhead of the invention from the processing chamber side.
Figure 7:
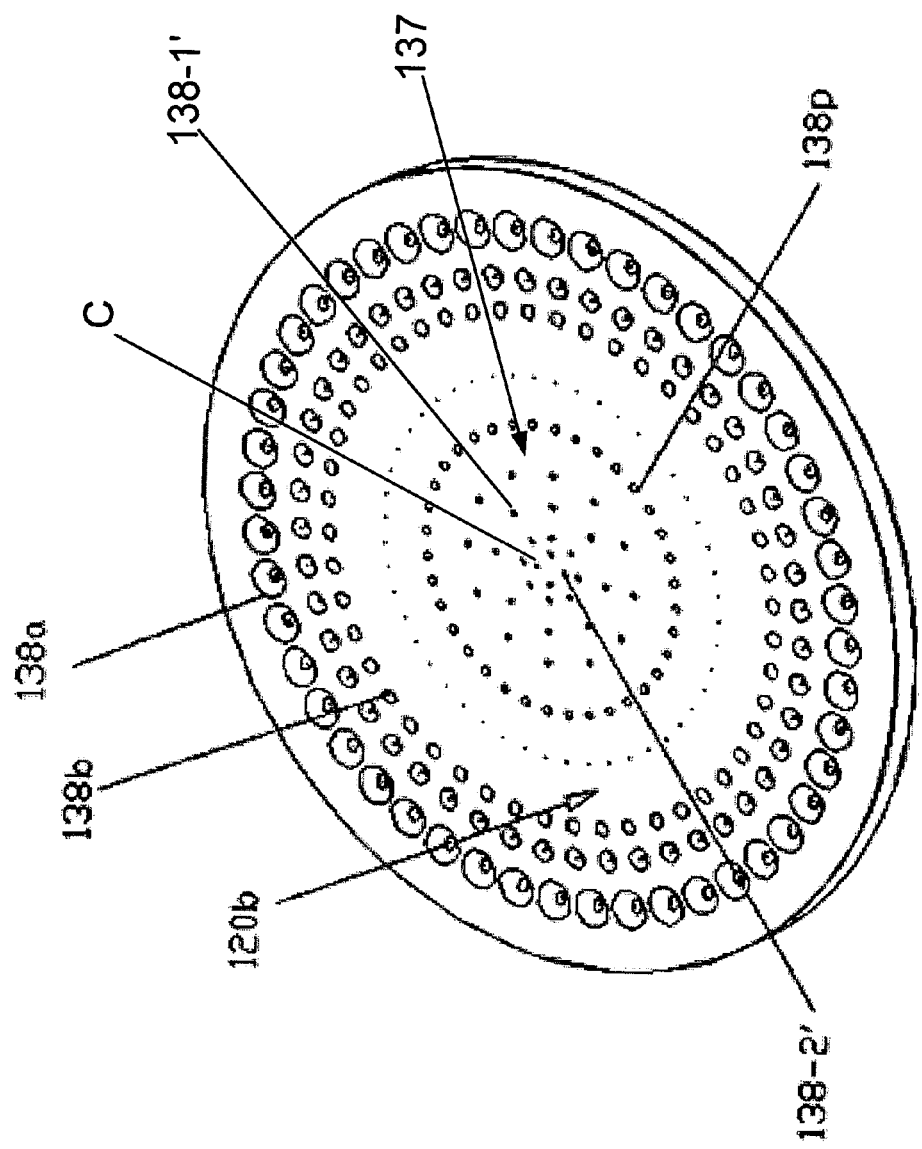
FIG. 7 is a three-dimensional view of the showerhead of the invention facing upward with the side that faces the cooling plate.

Similar to the conventional showerhead 20, the showerhead 120 of the invention has through gas holes 138a, 138b, . . . 138p (FIG. 5), the ends of which on the processing chamber are also shown in FIG. 6, which is a three-dimensional view of the showerhead 120 facing up with the front side 120a. It can be seen that the front side of the showerhead 120 is flat and looks similar to the front side 20a of the conventional showerhead 20, which is shown in FIG. 2. However, as shown in FIG. 7, which is a three-dimensional view of the showerhead facing up with the side that faces the cooling plate 122, the back side surface of the showerhead 120 does not have concentric and radial grooves as in the cooling plate but is provided only with entrances to the gas holes 138a, 138b, . . . 138p, the geometry of which is described later.

Figure 1:
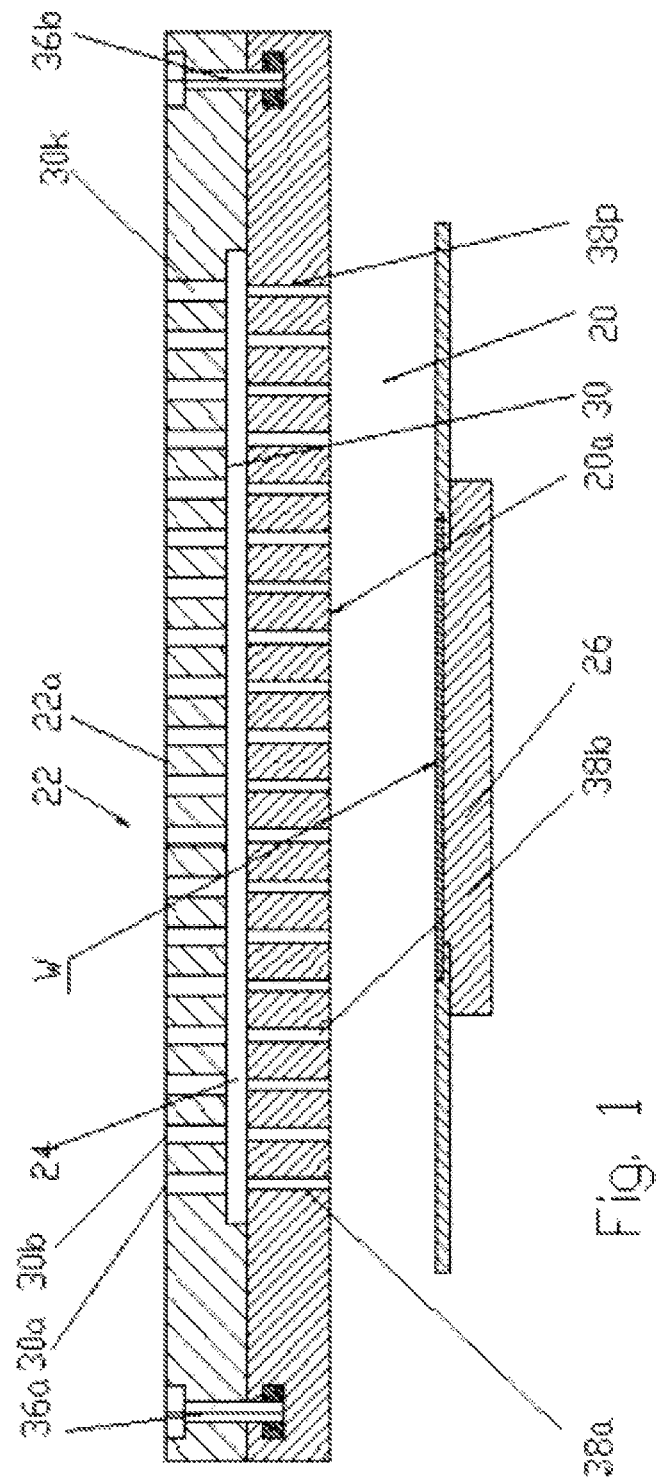
FIG. 1 is a schematic cross-sectional view of a conventional "showerhead/cooler plate assembly" that consists of a showerhead and a cooler plate which in an assembled state of the unit is pressed against the showerhead.

The cooler plate 122 of the system 100 of the present invention is the same as the cooler plate 22 shown in FIG. 1, the back side of which faces a manifold head (not shown).

In the system 120 of the invention, uniformity of plasma density is achieved by providing the gas holes 138a, 138b, . . . 138p of the showerhead 120 with a special geometry that makes it possible to adjust the gas permeability of the showerhead 120. In other words, this special geometry may change the density of plasma along the radius of the showerhead so that plasma density is maximal at the center of the plasma bulk, [i.e., at the showhead center C] minimal at the periphery, and gradually decreases in the intermediate portion toward the periphery.

Figure 8:
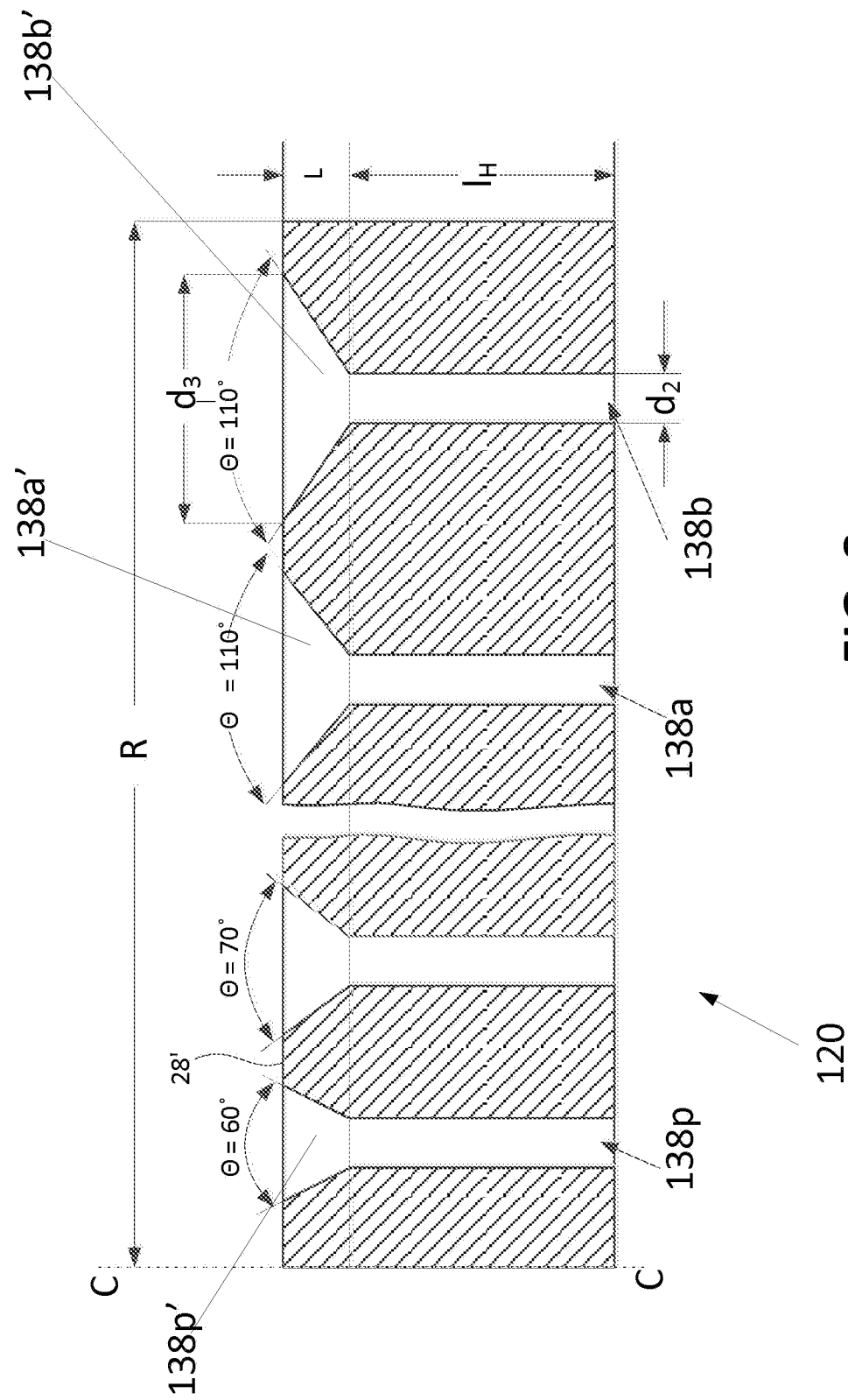
FIG. 8 is a fragmental cross-sectional view in the radial direction of the showerhead of the invention.

As shown in FIG. 8, which is a fragmental cross-sectional view in the radial direction of the showerhead 120, the gas holes 138a, 138b, . . . 138p are modified on the back side of the showerhead 120 and are converted into the nozzles 138a', 138b' . . . 138p'. The pattern of the gas holes 138a, 138b, . . . 138p is divided into a plurality of zones, three in the system illustrated in FIGS. 7 and 8, with showerhead permeability maximum at the periphery, gradually decreased towards the central area 137 in the intermediate portion, and the lowest permeability at the central area 137.

As mentioned above, on the inlet side 120b (FIG. 7), i.e., on the side of the showerhead 120 that faces the gas-accumulating reservoir 124 (FIG. 5), the holes are modified into conical nozzles 138a', 138b', . . . 138p' that are formed as countersinks on the inlet side 120b'. The nozzles 138a', 138b', . . . 138p' may extend from the peripheral part of the showerhead 120 to the central area of the showerhead, but, if necessary, several gas-distribution holes in the central part of the showerhead 120, such as passages 138-1', 138-2', etc., which are shown in FIG. 7, may remain intact, i.e., without formation of conical nozzles.

The geometry of the conical nozzles 138a', 138b', . . . 138p' (FIG. 8) is defined by angle θ of the cone that gradually increases from the central area of the showerhead toward the edges and depends on radial distance R of the showerhead from the showerhead central axis C-C.

The inventors herein have found that the following dependence exists between the angle θ, radius R of the showerhead, hole depth $I_H$, and hole $d_H$:

$$(1+bR)=[1-1/\{1-[(2I_H \tan \theta)/d_H]\}^4]^{-1/2} \quad (1)$$

where "b" is a coefficient that depends on the power source frequency, pressure in the plasma, type of processing gas, etc. For each specific design of the system and parameters of plasma process, in formula (1) the coefficient "b" and values of $I_H$ and $d_H$ are constant, and the angle θ depends only on radius R.

The gas-hole geometry described above will uniformly increase the gas flow from the peripheral zone and linearly through the intermediate zone to the central area 137, while the gas flow through the central zone stays unchanged. Such modification allows redistribution of gas density and enriches plasma density and ion flux proportionally with RF power losses, thus equalizing the density of the ion flux responsible for uniformity of etching.

The effect of ion flux equalization is shown in FIGS. 9a, 9b, 9c, 9d and FIGS. 10a, 10b, 10c, 10d, wherein FIGS. 9a, 9b, 9c, 9d relate to a conventional showerhead-cooler system, and FIGS. 10a, 10b, 10c, 10d relate to the showerhead-cooler system of the invention. In these drawings (a) shows the system, (b) shows distribution of RF power density over radius R, (c) shows distribution of gas density over radius R, and (d) shows ion flux density.

Figure 9A:
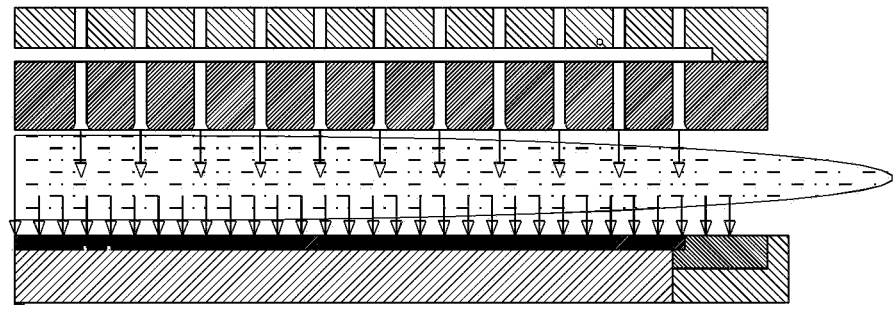
FIGS. 9a, 9b, 9c, and 9d and FIGS. 10a, 10b, 10c, and 10d show the effect of ion flux equalization, wherein FIGS. 9a, 9b, 9c, and 9d relate to a conventional showerhead-cooler system, and FIGS. 10a, 10b, 10c, and 10d relate to the showerhead-cooler system of the invention. In these drawings (a) shows the system, (b) shows distribution of RF power density over radius R, (c) shows distribution of gas density over radius R, and (d) shows ion flux density.
Figure 9B:
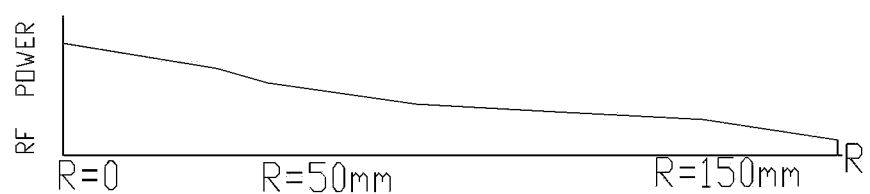
Figure 9C:
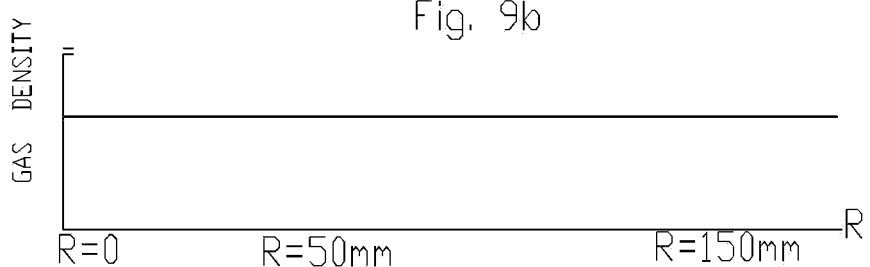
Figure 9D:
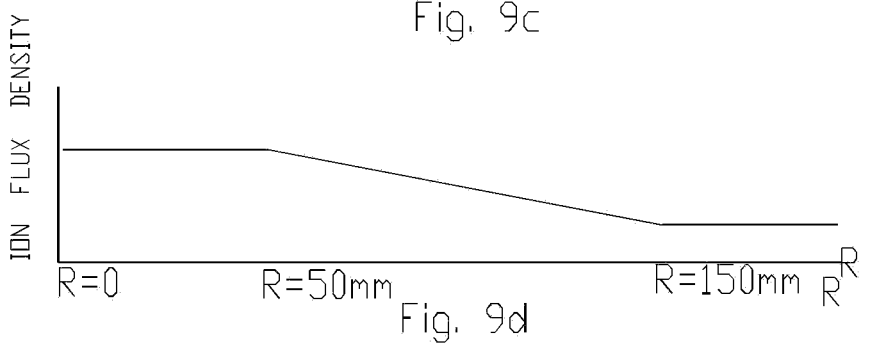

In FIG. 9b we can see nonuniform distribution of RF power from the central area to the edges of a conventional showerhead but only with increased diameters of the gas holes.

The gas flow (FIG. 9c) remains uniform according to the uniform geometry of the gas holes in the showerhead (FIG. 9a). However, the ion flux density is decreased from the central area to the edges.

Figure 10A:
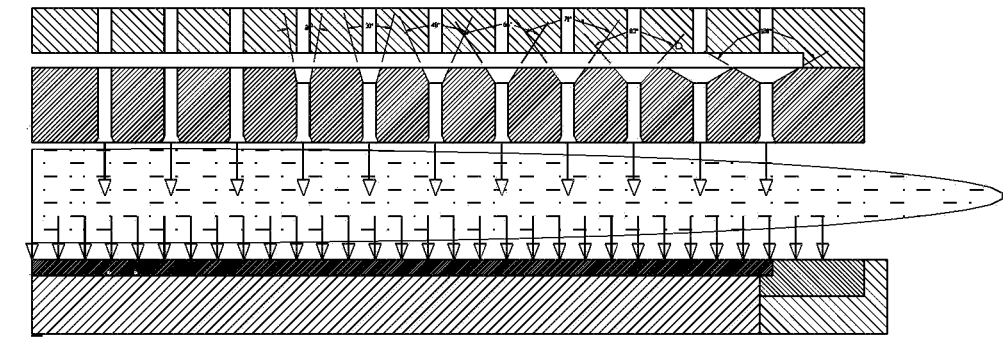
Figure 10B:
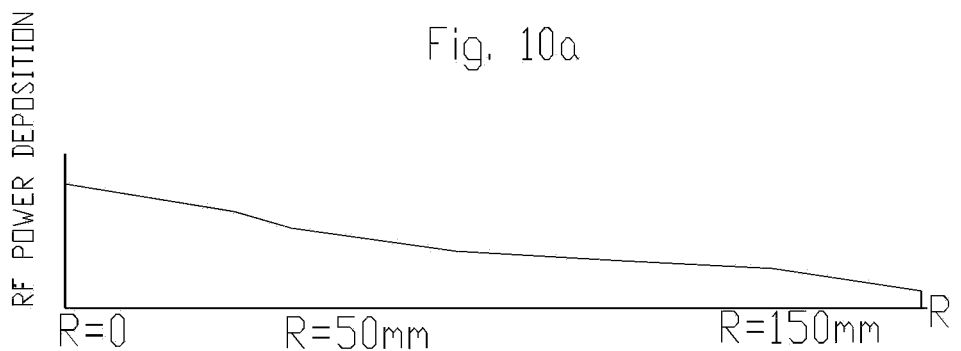
Figure 10C:
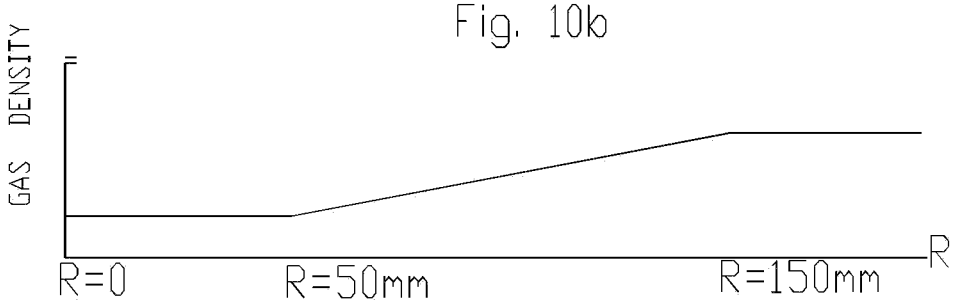
Figure 10D:
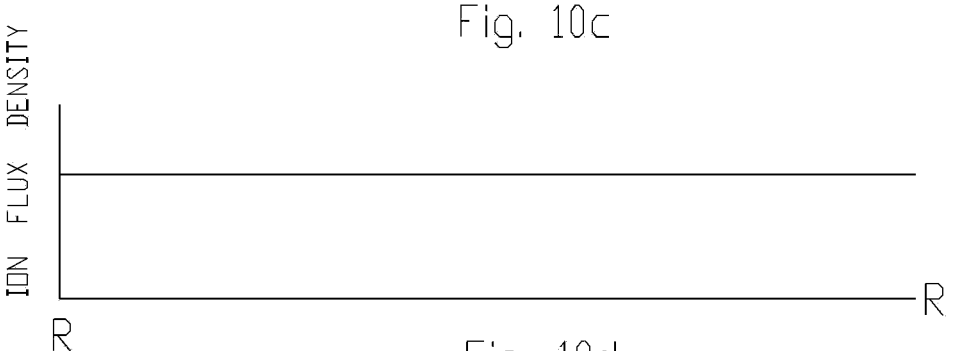

The geometry of the showerhead 120 modified according to the invention (FIG. 10a) with conical nozzles 138a, 138b, . . . 138p having angles increasing from the central area to the edges of the showerhead provides increase of gas flow density from the central area to the edges. As a result, in spite of the same nonuniform distribution of RF power, ion flux density and responded etching uniformity are equalized from the central area to the edges of the wafer (FIG. 10d).

However, as mentioned earlier, the geometry of some large nozzles may coincide with the geometry of the so-called hollow cathode that occurs in the intensive high-current RF electron and ion systems and causes the phenomenon known as "hollow cathode discharge." In other words, since the gas holes are modified, in the presence of electrical fields used, for example, during plasma launching, hollow cathode discharges may be triggered within the gas holes 138a, 138b, . . . 138p (FIG. 5), especially in the nozzle areas (FIG. 8). In plasma processing, such hollow cathode discharges may lead to plasma power loss and particle generation due to erosion of the showerhead material. A parasitic plasma discharge can occur in the nozzle in the vicinity of the side walls of the nozzle.

The parasitic discharge triggered by these instabilities may occur during the above-described processes on the back side surface 120a of the showerhead 120, especially on the sharp edges of the entrance to the gas holes (FIG. 8), and the nozzles increase this risk to a greater degree.

The electrons generated by this discharge can oscillate inside the cavity of the nozzle. The oscillating electrons cause multiple ionization, thereby generating dense parasitic plasma. The RF-powered parasitic hollow discharge is a source of ions that can bombard the surface of the nozzle. This bombardment causes a secondary electron emission and heating of the surface with thermal ionic emission. The emission of secondary electrons contributes to the total electron density and further enhances the hollow cathode discharge. Moreover, charged particles generated by the hollow cathode discharge spread in the gas flow and carried by the gas flow can penetrate through the gas holes into the processing plasma. If these particles are ejected from the gas holes, they cause local enrichment of plasma density in the vicinity of the outlet of the passages. Such local enrichment attracts high-energy ions from the bulk plasma during the half-cycle when the showerhead becomes negative to the plasma bulk. The bombardment of the edges at the exit of the gas holes by these ions develops craters that can be 2 to 3 mm deep. Products of erosion deposited on the surface of the showerhead contaminate the wafer.

Figure 11:
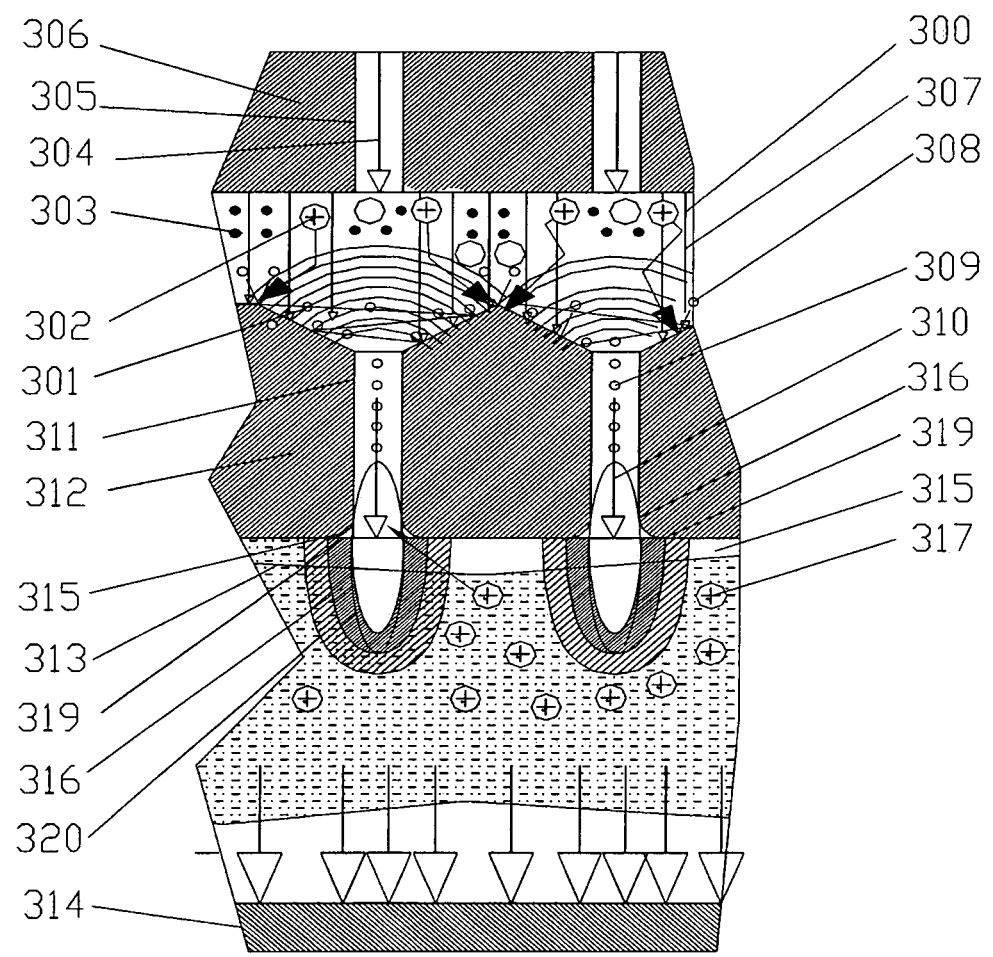
FIG. 11 is a sectional view of a part of the system of the invention that illustrates development of the parasitic hollow discharge and the protective mechanism of the invention provided by the provision of conical nozzles.

FIG. 11 is a sectional view of a part of the system of the invention that illustrates development of the parasitic hollow discharge and the protective mechanism of the invention provided by the conical nozzles. FIG. 11 shows that the geometry of gas holes in the showerhead of the present invention drastically increases the gas-gap depth 300 and prevents the gas reservoir from arcing under unstable conditions.

The picture also illustrates development of the parasitic hollow discharge that started after bombardment of the surface of the nozzles 301 by the heavy ions 302 generated as a result of ionization of the molecules 303 of the processing gas injected through the gas passages 305 of the cooler plate 306 into the gas reservoir 307. These ions knock out the secondary electrons 308 that, in turn, strike the developed large surface of the nozzles and initiate an avalanche emission transformed into the hollow discharge. The charged species 309 carried by the gas flow 310 penetrate the gas holes 311 in the showerhead 312. Being injected into the processing plasma discharge 313 between the showerhead 312 and the wafer 314, they enrich the plasma sheath 315 in the vicinity of the outlets 316 of the holes 311. Thus, the plasma density in the vicinity of the outlets of the gas holes 311 is increased, developing a plasma electron layer 316' with high electron density.

Initially, the gas flow 310 is just a carrier of the charged species generated by the hollow discharge in the vicinity of the nozzle. However, during the period of positive potential on the showerhead 312 after development of the craters, the electrons of the processing plasma discharge 313 penetrate into the gas holes and ionize the gas flow 310 in these holes, and covert the gas flow into a high-temperature plasma torch 319' that causes erosion on the outlets of the holes and deepens the craters 319 up to 3 mm. This deteriorates the total plasma density distribution and uniformity of the ion flux 317. As a result, plasma etching of the wafer 314 in the areas in front of the outlets 316 becomes nonuniform.

The craters 319 reduce the lifetime of the showerhead 312 that needs to be re-polished for re-use, whereby the thickness of the showerhead 312 is decreased from 10 mm up to critical 8.5 mm. As a consequence, the length of the gas holes 311 is shortened, gas resistance drops, and the vacuum communication between the processing chamber and the gas reservoir exceeds the critical value. The showerhead 312 also becomes fragile, and tightening of the screws for assembling the showerhead 312 with the cooler plate 306 may break the silicon. Sputtering of the material at the edges of the outlets generates a dust cloud 320 in the plasma and contaminates the wafer by deposition of the so called "black silicon grass." In other words, the parasitic hollow discharge appears to be an obstacle to enhancing the uniformity of plasma etching through invented geometry and distribution of the nozzles at the entrances of the gas holes.

In accordance with the present invention, the above problem is solved by coating the backside of the showerhead, especially the entrance into the nozzle, the throat of the nozzle, and even partially the inner surface of the gas hole, with an insulation coating that is characterized by high resistance to electrical breakdown and to chemical corrosion. In addition to corrosion resistance, this coating should withstand thermal cycling during the plasma-etching process when the temperature of the showerhead increases to 800° C. The inventors herein have found that the coating material that can withstand the above-mentioned severe condition is silicon carbide or yttrium oxide ($Y_2O_3$). In the system of the invention, the coating may have a thickness in the range of 2 μm to 10 μm. Since the above-described geometry of gas holes with nozzles on the inlet side is inapplicable without the use of a protective coating that is resistant to electrical breakdown and chemical corrosion, such a coating must be considered as an indispensable part of the present invention.

Furthermore, a conical nozzle facilitates manufacturing and provides flexibility in converting the existing design to one with a higher flow rate without major redesign. Such a geometry can be easily performed using standard countersink drill bits, e.g., with 10° to 60° convergent half-angles. The configuration of this conical nozzle is shown in FIG. 8. The narrow end of the nozzle comprises the nozzle throat that has the same cross-section as the gas hole of the showerhead and has the same diameter $d_2$ that ranges from 0.5 mm to 1 mm, while at the entrance end on the back surface of the showerhead the nozzle may have a diameter $d_3$ that is one and one-half to four times greater than the diameter $d_2$. However, the diameter $d_3$ must be limited by the contours of the neighboring nozzles on the back side of the showerhead. In other words, the sum of radiuses of the neighboring nozzles on the back side of the showerhead should not exceed the distance between the central axes of the neighboring gas holes. In FIG. 8, the line C1-C1 is the central axis of the showerhead. The angle of the nozzle convergent cone section θ may range from 0 to 120°.

The function of the nozzle is to convert the slow gas flow in the gas-accumulating reservoir into high-velocity gas flow through the gas hole. The flow of gas through the nozzle is driven from the high pressure $p_1$ developed in the gas-accumulating reservoir at the nozzle entrance toward the low static pressure $p_2$ in the processing chamber. The flow through the nozzle is different from the flow through the gas hole because of the gradual decrease in cross-sectional diameter, whereby the flow rate through the nozzle may be ~2.75 times higher than the flow rate through the passage.

Figure 12:
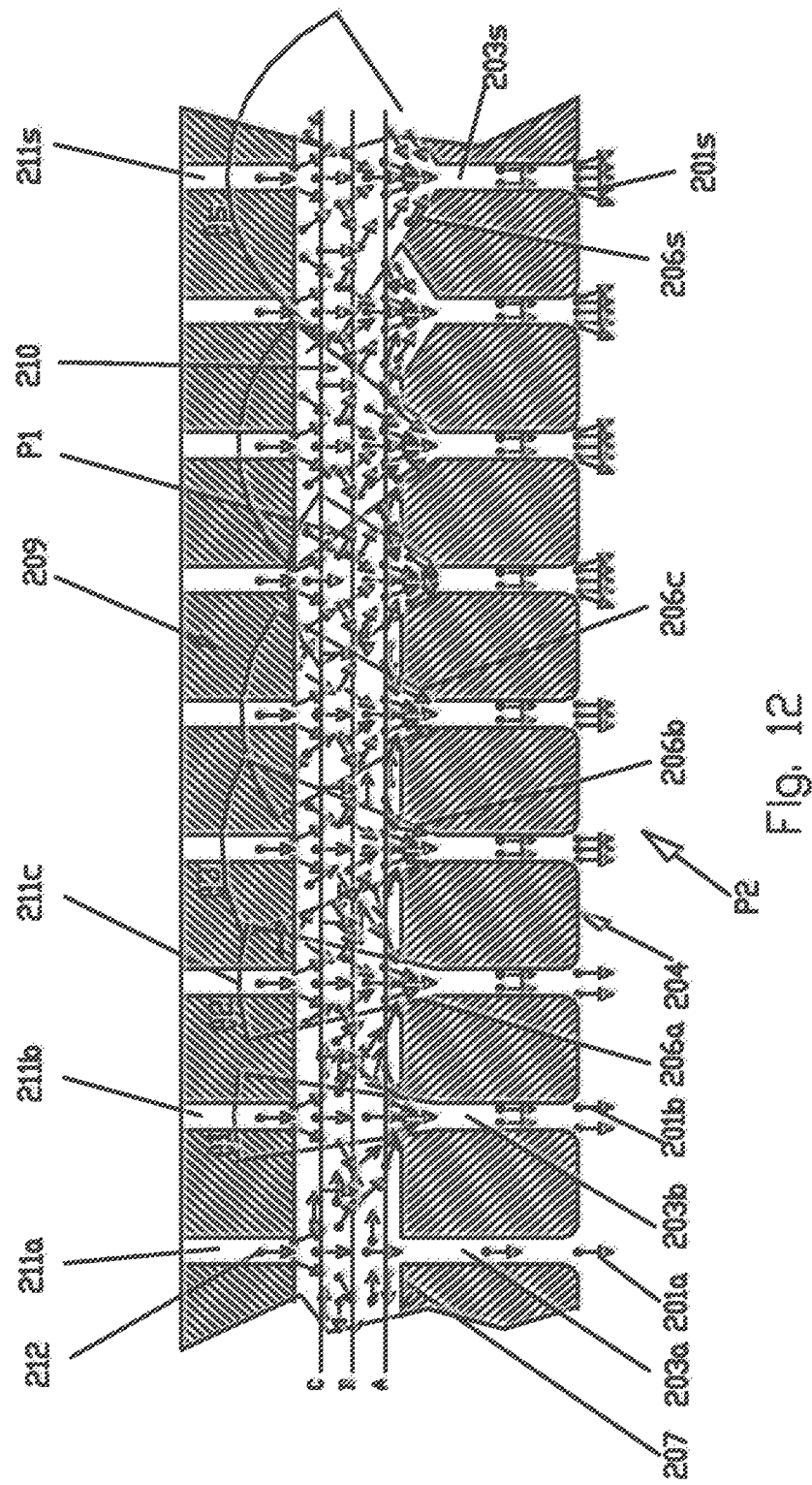
FIG. 12 is a sectional view of the system of the invention that illustrates the flow of gas molecules and their interaction with the profiles of entrances into the gas holes of the showerhead.

FIG. 12 illustrates a mechanism of distribution of gas flow 201a, 201b . . . 201s with different flow rates ejected into the processing chamber (not shown in FIG. 12) under a pressure P1 from the gas holes 203a, 203b . . . 203s of the showerhead 204. Such nonuniformity of gas flow is provided by funneling the entrances of these gas holes with the use of nozzles 206a, 206b, . . . 206s formed on the back side 207 of the showerhead 204.

As mentioned above, the angle θ varies with increase from the central area of the showerhead 204 to the edges. The central gas holes may even have θ equal to zero. This is shown in FIG. 12 where there is no nozzle at the entrance to the gas hole 203a. In FIG. 12, reference numeral 209 designates a cooling plate, and 210 designates a gas-accumulating reservoir where gas is maintained under pressure P2. The cooling plate 209 supplies the reservoir 210 with a processing gas through the gas holes 211a, 211b, . . . 211s with a uniform geometry and uniform distribution of gas flow 212. If the gas holes were uniform in diameter without conical nozzles, only a part of the flow (known as "core flow") would penetrate the gas holes. Because the diameter of the gas holes 203a is much smaller than the gas entrance diameter on the nozzles of other holes, this creates resistance to the inlet flow of the gas molecules. In FIG. 12 such a hole is the central gas hole 203a, which does not have a conical nozzle like the other gas holes 203b to 203s. Small arrows show the direction of gas molecules. The aforementioned resistance prevents vacuum communication between the processing chamber (not shown) and the gas reservoir 210. It can be seen that the gas molecules of the core flow have vector velocity normal to the back-side surface of the showerhead 204. Because of limited gas transmission through the gas hole 203a, the majority of molecules of the gas flow with the vector velocities different from normal are deflected from the core flow and fill out the gas reservoir 210 with chaotic movement.

The gas molecules deflected from the core flow are apparently dwelling in gas layers A, B, and C inside the reservoir 210. Molecules of level A that are nearest to the back-side surface of the showerhead 204 have a higher probability than molecules of layers B and C. However, according to the invention, acceptance of gas molecules by the gas holes is changed by funneling the gas-hole entrances and thus increasing the cross-sectional area for penetration of local molecules from the layer A into the respective gas hole. As a result, the outgoing gas flow and, hence, the gas-flow velocity is increased and the value of this velocity will depend on the cone angle and the new length of the gas hole.

Of course, such funneling reduces gas resistance, and the depth of the nozzle should not exceed a threshold value at which permeability of the showerhead becomes so high that pressure in the processing chamber as well as in the gas reservoir becomes unstable. As mentioned above, the flow of gas through the nozzle is driven by pressure difference between a pressure P1 developed in the gas-accumulating reservoir 210 (FIG. 12) at the nozzle entrance and static pressure P2, which is lower than P1 and exists in the processing chamber. Due to the provision of conical nozzles, the flow rate through the conical nozzles may be ~2.75 times higher than the flow rate through a conventional gas hole where the cone angle is zero.

If the angle of a nozzle is increased to 60 degrees, gas molecules from layer B will have the probability of approaching the entrance of the hole and will have passage through this hole together with the core flow and flow through layer A. Next, at angle 120 degrees, the cross-sectional area becomes so large that the gas molecules from layer C, which is furthest from the surface of the showerhead 204, can be transported through the gas hole (such as hole 203s) together with molecules of the core flow, and flows from layers A and B thus increasing the total flow rate. In the manner described above, permeability of the showerhead will be nonuniform and can be controlled from the central area to the periphery according to linear as well as nonlinear law.

Let us assume that gas flows down through the gas hole having a cross-sectional area $A_1$ with a velocity $V_1$ and that the flow encounters a change when passing through the cross-sectional area $A_2$ of the throat. In this case, the gas velocity changes in accordance with the following formula:

$$V_2[1-(A_2/A_1)^2]^{-1/2}[2(p_1-p_2)/\rho]^{1/2} \qquad (2)$$

where $\square$ is gas density.

Since mass flow rate M is a product of gas density, flow area, and velocity, the following can be written:

$$M=\rho A_2 V_2 \qquad (3)$$

Because the flow areas are proportional to their diameters in the power of two, and because the diameter at the nozzle entrance can be presented as $$d_1=d_H+2I_H \tan \theta \qquad (4)$$

where $I_H$ is depth of the convergent profile, $d_H$ is diameter of the gas hole, and $\theta$ is the semi-cone angle of the nozzle, the mass flow rate can be presented as follows:

$$M=[\pi(d_H)^2/4][1-1/\{1-[(2I_H \tan \theta)/d_H]\}^4]^{-1/2}[2\rho(p_1-p_2)]^{1/2} \qquad (5)$$

In order to enhance uniformity of ion flux density, the mass flow is supposed to be changed as a function of radius of the showerhead:

$$MR=M_0+M_0(1+bR)+M_{max} \qquad (6)$$

where $M_0$ is minimal mass flow rate for the area of the showerhead where $\theta=0$ no nozzle) from radius 0 to 50 mm, and $M_{max}$ is maximal mass flow rate with $\theta_{MAX}=60°$ for the area from radius R=150 mm to R=280 mm and b=2.75×10⁻².

In the intermediate area from R=50 mm to R=150 mm, the nozzle angle $\theta$ is a function of radius R and can be found from the following expression:

$$((1+bR)=[1-1/\{1-[(2I_H \tan \theta)/d_H]\}^4]^{-1/2} \qquad (1)$$

The nozzle is usually made long enough such that pressure in the reservoir is reduced at the nozzle throat to the pressure inside the gas holes.

The present model is based on the fact that the converging nozzle operates steadily, thus the stagnation conditions of pressure and temperature in the gas-accumulating reservoir or the plasma chamber upstream of the converging nozzle are homogeneous and continuous.

If the cone-shaped nozzle had been absent, penetration of the gas into the gas holes would have been performed under conditions of sharp, local pressure change. In opposite, the nozzle facilitates smooth entrance of gas molecules from the larger area of the reservoir and contracts this flow. In order to control gas flow through the nozzles with conical entrances, angle $\theta$ must be variable in the radial direction of the showerhead. This is required because the radial velocities of gas decrease to the central area and in the central area is equal to zero. Thus, for the system of a 450-mm wafer, angle $\theta$ may be equal to zero in the central area, i.e., in the area of the showerhead from the central area to R about 50 mm where RF power is maximal. At the same time, angle $\theta$ should be linearly increased from $\theta=0$ to about 120° in the area with R between 50 mm to 150 mm, and should be equal to 120° in the area with R of ~150 mm to ~240 mm where RF power is minimal. Such geometry will change radial distribution of the gas flow injected into the plasma bulk.

As mentioned above, a commensurable rule of similarity proven in the past cannot be applied to a situation in which the wavelength and size of the showerhead become approximately of the same order. Nonuniformity of plasma density and the followed nonuniformity of ion flux responsible for etching large-area wafers are caused by nonuniform RF power deposition into processing plasma. This can be corrected, and the correction tool that is often used in plasma technology is controlled gas distribution. In a very rough approach it can be designed inversely proportional to the RF power deposition, but in a fine approach it can be found experimentally through funneling of the gas holes. Gas supply should be reduced smoothly in the central area where RF power distribution density is high and should be increased and abruptly boosted in the middle and at the periphery.

Increasing the gas flow rate in the direction from central area of the showerhead, especially close to the edge, can increase gas density in this area and intensify ionization around the periphery of the showerhead in comparison to the central area where gas flow remains unchanged. Thus, plasma density at the periphery can approach plasma density in the center just by adding gas flow in this area. By forming nozzles at the entrance to the gas holes and by controlling the geometry of the nozzles, we can smoothly increase ionization in the intermediate area between the center and periphery of the showerhead and equalize the ion flow even at such complicated initial distribution as the Bessel function. Thus, it will be possible to adjust the distribution of plasma density to a uniform level across the entire showerhead.

In the plan view of the showerhead (FIG. 6), the passages having the nozzles of the same geometry are arranged circumferentially on a common circle and with an equal pitch from each other. In order to prevent overlapping, the sum of radiuses of the neighboring nozzles should not exceed the distance between the central axes of the neighboring passages. At the same time, the maximal depth L (FIG. 8 of the nozzles) also must be considered for the possibility of subsequent refurbishing by re-polishing the surface of the showerhead on the processing side. This is important in view of the high manufacturing cost of silicon and machining. As the showerhead is re-polished, the thickness of the showerhead decreases, and the throat of the nozzle approaches the processing surface. Thus, control of showerhead permeability used in this invention as a tool for adjustment of uniformity in plasma density cannot exceed a threshold at which the balance between pressure in the processing chamber and the gas reservoir is violated. Moreover, in the course of RF treatment at positive potential on the showerhead, short gas holes may become permeable to leakage of electrons from the processing plasma into the gas reservoir. Therefore, taking into account at least two refurbishing by polishing of the processing surface of the showerhead, the length of the holes provided with nozzles should be no less that 5 to 6 mm.

Because the reactive component of the impedance of the gas reservoir is too high, almost the entire RF power should be transported through ohmic contact with the cooling plate at the periphery of the showerhead. However, in case of mismatching when the frequency becomes too high, the gas reservoir becomes a total conductor and the transfer of RF power may occur mainly through the gas gap.

However, if the RF generator is mismatched, the RF current fluctuations may have much higher frequency than the critical frequency. Such situations must be taken into account at a design stage for providing a gas gap that could withstand the above condition. In other words, even arcing in the processing chamber, which abnormally lowers the reactive component of gas-gap impedance and causes high RF power leaks through the gap, can be withstood if the gas gap has a correct dimension.

Because this gas gap is very sensitive to any instabilities, in conventional showerheads the depth of the recess in a cooler plate is designed according to the Paschen's Law, which also determines pressure in the gas reservoir. According to this law, the thickness of the gas layer can be determined so as to prevent occurrence of the discharge during abnormal situations in an RF circuit. In the present invention, however, Paschen's Law is breached by the formation of funneled nozzles at the entrances of the conventional gas holes since the funnels increase the depth of the gas gap and thus exceed the critical breakdown thickness of the gap. Moreover, funneling increases the backside-surface area. The showerhead becomes more sensitive to different parasitic processes that could be tolerated prior to funneling.

Other detrimental effects of mismatching are exfoliation of a liner of the plasma chamber, contamination of the electrodes by the etching products, deterioration of vacuum conditions, occurrence of a stray arc corona on sharp edges of the gas holes on the gas reservoir side, etc. The heavy ions of the stray discharge bombard the developed surface of the nozzles. During striking they cause ion-electron emission, thus releasing inner electrons from the bombarded surface. After gaining energy from the RF field in the gaseous gap between the showerhead and cooler plate, the generated electrons strike the surface of the nozzle and cause secondary electron emission. Now, the entire surface of the nozzles serves as a large secondary electron emitter (hollow cathode). As a result, electrical breakdown provoked by micro-arcs appears to be an avalanche current in the RF circuit. Such a parasitic hollow discharge that occurs in the gaseous gap is called a "hollow cathode discharge." The hollow cathode discharge consumes a valuable part of the RF power. It may completely deteriorate the processing plasma, shorten lifetime of the showerhead, and violate purity of etching. The gas flow ionized by the hollow cathode discharge becomes a carrier of some seed-charged particles that enrich the electron plasma density in the vicinity of the gas hole exits. Furthermore, the plasma sheath bordering the processing surface of the showerhead in the vicinity of the hole exits deteriorates as well. High electron density in the vicinity of the gas hole exits attracts high-energy ions from the processing plasma. These ions bombard the sharp edges of the holes and sputter silicon. At the same time, highly active radicals of the processing plasma provide intensive etching, and the edges of the holes are quickly eroded, therefore deepening the conical geometry up to the craters with a depth up to 3 mm. Gas resistance of the holes decreases, and the flow of gas through the craters increases. The eroded silicon dust is charged in plasma and moves to the edge of the showerhead. Being deposited on the periphery of the showerhead, it creates black silicon that contaminates the wafers. The charged species from the processing plasma meet the ionized gas ejected from the gas holes and enrich the weakly ionized gas flow that exits into the processing chamber. During some conditions the flow increases because of the erosion of the gas holes into high-temperature torches that destroy the gas hole exits on the processing chamber side.

Thus, under mismatched conditions, the system of the invention for improving uniformity of plasma density by controlled gas distribution becomes counterproductive and may worsen the plasma etching process.

Funneling, alone, may be insufficient without protecting the back side of the showerhead, and especially the surfaces of the nozzles and partially the inner surfaces of the gas holes by coating these surfaces with a film highly resistant to electrical breakdown, plasma chemical corrosion, flaking, and thermal shocking. This coating should also be applied onto the inner surfaces of the gas holes as deeply as possible and should bond to such surfaces as strongly as possible. Therefore, the heat that provides the deposition should be delivered into the gas holes as deeply as possible.

It has been experimentally found that a chemical plasma corrosion-resistant coating with a thin film of silicon carbide or yttrium oxide is the best selection for accomplishing the above goal. As mentioned above, if the geometry of the gas holes of the showerhead is incorrect and violates critical dimensions of the gas gap, a serious problem, which is known as a "parasitic hollow cathode discharge," on the surfaces of the nozzles may occur. Therefore, these surfaces as well as the inner surfaces of the gas holes must be protected by a thin insulation layer that allows RF power to propagate through the hole without damaging the surfaces in the area of the gas gap with electrical breakdown. Without such protection, the lifetime of the showerhead may be shortened to a level unacceptable for industrial application.

It should also be mentioned that in addition to protection from parasitic discharges, the insulating layer must withstand thermal cycling during the etching process in which the temperature of the showerhead rapidly rises to 600° C. and then drops to room temperature. Moreover, the protective layer also should withstand erosion from highly corrosive processing gases. One of the materials capable of withstanding such severe conditions is $Y_2O_3$. Conventional coatings used for plasma etching applications are porous, have low adhesion, and are subject to exfoliation. With a decrease of the deposited layer from microns to nanomicrons, adhesion and density are improved because of the increase in surface energy.

Nanocoating with $Y_2O_3$ forms an effective protective layer that protects the coated layer from corrosion and at the same time from arcs and hollow cathode discharge.

Figure 13:
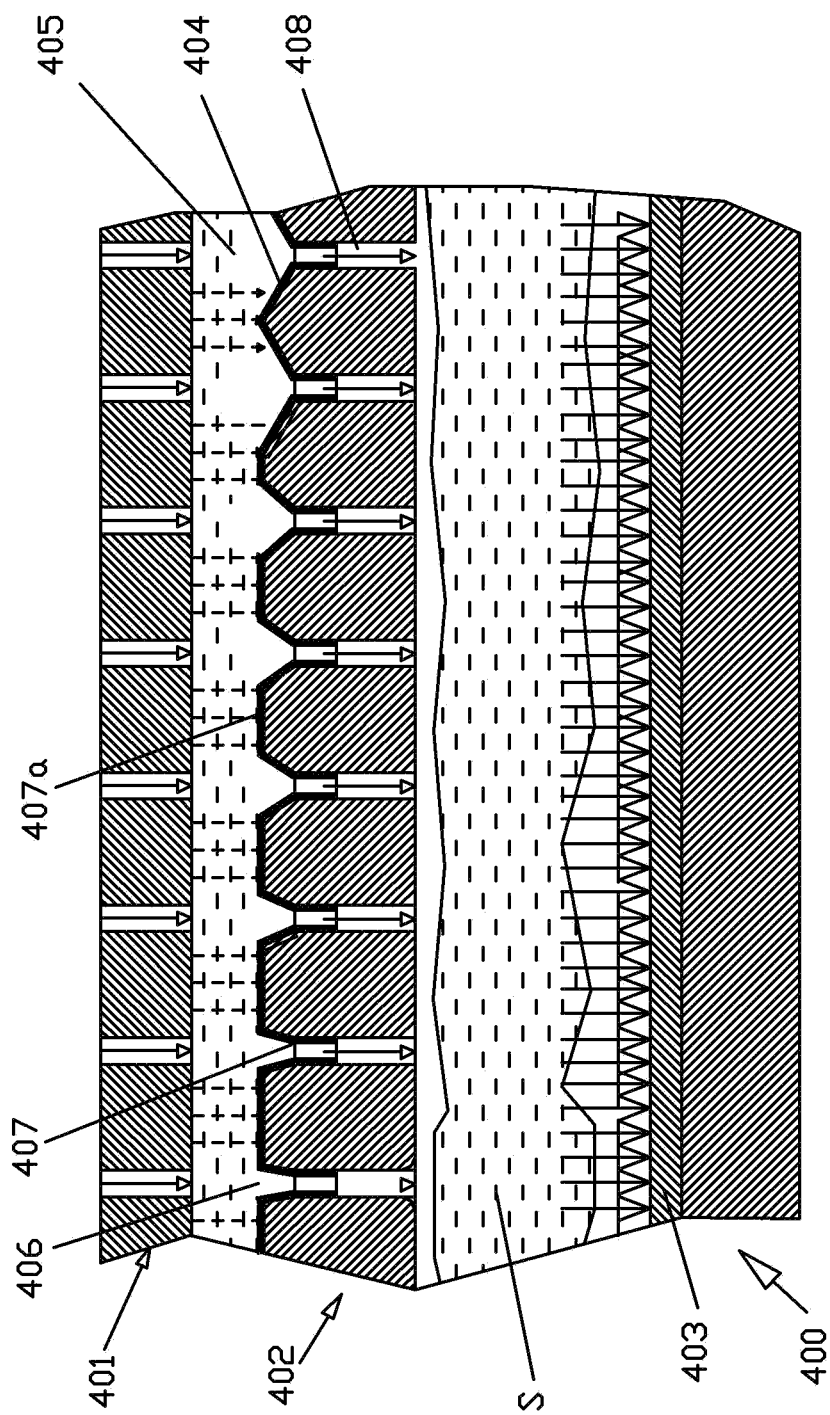
FIG. 13 is a sectional view of the system of the invention that illustrates positions of the protective coatings on the back side of the shower head, on the surfaces of the conical nozzles, and on the inner walls of the gas holes.

The $Y_2O_3$ coating shows the following properties:
Porosity (%): 2%
Density: 5.0 g/cc
Thermal conductivity: 8 to 12 W/m ° K
Hardness: >500 HV 0.3 (by cross-section) Ra (µm) 120
Coefficient of thermal expansion (CTE): 8-9 µm/m/C
Dielectric constant: 12 to 13 (ASTM D 159)
Specific Electrical Resistance: 10 exp 15 Ohm cm
Adhesion: 7,000 psi
Breakdown voltage (V/mm): 2.75×10 exp 6 V/cm
Breakdown strength: 3.8 MV cm$^{-1}$
Leakage current density: 10 exp (−6) A/cm 2 at 1.3×10 exp 6 V/cm
Impedance: I kOhm
Corrosive resistance:
Lifetime: 1000 h FIG. 13 is a fragmental sectional view of a showerhead-cooler system 400 of a semiconductor-processing chamber comprising a cooler plate 401 and a showerhead 402. Reference numeral 403 designates a semiconductor wafer located in the processing chamber S. The tapered surfaces 404 of the showerhead 402 should be protected by nanocoating 407a of $Y_2O_3$ in order to prevent destruction from the parasitic hollow discharge in the gas reservoir 405 as well as from sputtering of the nozzle 406 at the inlet to the gas holes 407 and from contamination of the wafer 403 by the sputtering products. Nanocoating is applied to the tapered surfaces 404 of the nozzles 406 and to a part of the inner surfaces 407 of the gas holes 408 where the probability of arcing with the hollow cathode discharge is high. However, coating layers 407a on the sharp edges are less adhesive and more susceptible to exfoliation under the effect of mechanical stress and/or thermal cycling. If such coatings exfoliate, the exposed surfaces will no longer be protected against arcing. The inner walls of the gas holes also should be coated with a coating layer 407a at least to the depth of 5 mm from the surface of the showerhead 402.

An apparatus for application of the protective $Y_2O_3$ coatings onto the large surfaces of a 600-mm-diameter showerhead as well onto the conical surfaces of the nozzles and inner walls of the gas holes are subjects of another co-pending patent application of the same inventor (U.S. patent application Ser. No. 14/164,168).

Although the invention has been shown and described with reference to specific embodiments, it is understood that these embodiments should not be construed as limiting the areas of application of the invention and that any changes and modifications are possible provided that these changes and modifications do not depart from the scope of the attached patent claims. For example, the angle θ may vary in a range different from 0 to 120°. The plasma-resistant coating may be made from a material different from silicon carbide or yttrium oxide, e.g., yttrium-stabilized zirconium. The system of the invention is described in application to a wafer having a diameter of 450 mm. However, the system of the invention is applicable to plasma treatment of semiconductor wafers or other objects with diameters that are smaller or greater than 450 mm. The excitation frequency may be different from 150 MHz, which is used in the description of the invention and may comprise 80 MHz, 40 MHz, etc., however, with different distribution of gas flow.

What is claimed is:

1. A showerhead-cooler system of a semiconductor-processing chamber of a CCP plasma processing apparatus intended for processing of objects with a plasma process, comprising: a showerhead having a plurality of through gas holes; a gas-feeding cooler plate that is connected to an RF power supply, has electrical contact with the showerhead, and forms with the showerhead a gas-accumulation reservoir that communicates with the through gas holes of the showerhead; a gas-feeding cooler plate has a plurality of through gas-feeding passages that communicate with the gas-accumulating reservoir; a showerhead having a front side that faces the semiconductor-processing chamber, a back side that faces the cooler plate, a peripheral portion, which is in said electrical contact with the cooler plate, and a central area which has a showerhead center C; on the back side of the showerhead the through gas holes of the showerhead having conical nozzles with a cone angle θ that decreases in the direction from the peripheral portion to the showerhead center; the object being a semiconductor wafer, each through gas hole has a diameter $d_H$, a length $l_H$, and being located at a predetermined radial distance R from the showerhead center and wherein the following relationship exists between the cone angle θ of the conical nozzle of a through gas hole and a radial distance R of the gas hole from the showerhead center:

$$1+bR=[1-1/\{1-[(2l_H \tan \theta/d_H)]^4\}]^{-1/2} \qquad (1)$$

where "b" is a coefficient that depends on the parameters of the plasma process.

2. The showerhead-cooler system of claim 1, wherein the cone angle of each nozzle decreases in the direction from the peripheral portion to the central area of the showerhead from 120° to 0°.

3. The showerhead-cooler system of claim 1, wherein the cone angle of the conical nozzles linearly decreases in the direction from the peripheral portion to the showerhead center.

4. The showerhead-cooler system of claim 3, wherein cone angle of each nozzle decreases in the direction from peripheral portion to the showerhead center from 120° to 0°.

5. The showerhead-cooler system of claim 1, wherein surfaces of the conical nozzles and at least a part of the walls of the gas holes in the area adjacent to the conical nozzles have a protective coating resistant to electrical breakdown and chemical corrosion.

6. The showerhead-cooler system of claim 5, wherein the protective coating is an yttrium oxide coating.

7. The showerhead-cooler system of claim 6, wherein the cone angle of each nozzle decreases in the direction from the peripheral portion to the of the showerhead center from 120° to 0°, the through gas-feeding passages of the cooler plate being coaxial with the gas holes of the showerhead.

8. The showerhead-cooler system of claim 1, wherein the wafer has a diameter of 450 mm.

9. The showerhead-cooler system of claim 7, wherein the surfaces of the conical nozzles and at least a part of the walls of the gas holes in the area adjacent to the conical nozzles have a protective coating resistant to electrical breakdown and chemical corrosion.

10. The showerhead-cooler system of claim 9, wherein the protective coating is an yttrium oxide coating.

11. The showerhead-cooler system of claim 10, wherein the cone angle of each nozzle decreases in the direction from the peripheral portion to the central area of the showerhead from 120° to 0°.

* * * * *